(12) United States Patent
Shin et al.

(10) Patent No.: US 9,349,957 B2
(45) Date of Patent: May 24, 2016

(54) METHOD FOR FORMING OLED DEVICES WITH PATTERNED HOLE OR ELECTRON TRANSPORT LAYERS

(75) Inventors: Hyea-Weon Shin, Yongin (KR); Seung-Mook Lee, Yongin (KR); Sang-Hun Park, Yongin (KR); Jae-Bok Kim, Yongin (KR); Young-Il Kim, Yongin (KR); Jae-Kook Ha, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 273 days.

(21) Appl. No.: 13/432,823

(22) Filed: Mar. 28, 2012

(65) Prior Publication Data

US 2012/0319089 A1 Dec. 20, 2012

(30) Foreign Application Priority Data

Jun. 16, 2011 (KR) .......................... 10-2011-0058265
Sep. 9, 2011 (KR) .......................... 10-2011-0091690

(51) Int. Cl.
*H01L 51/54* (2006.01)
*H01L 51/00* (2006.01)
(Continued)

(52) U.S. Cl.
CPC ........ *H01L 51/0014* (2013.01); *H01L 27/3246* (2013.01); *H01L 51/003* (2013.01); *H01L 51/0015* (2013.01); *H01L 51/0016* (2013.01); *H01L 51/0017* (2013.01); *H01L 51/0018* (2013.01); *H01L 51/0019* (2013.01); *H01L 51/5056* (2013.01); *H01L 51/56* (2013.01)

(58) Field of Classification Search
CPC ............ H01L 51/0016; H01L 51/0017; H01L 51/0018; H01L 51/0014; H01L 51/5056; H01L 51/0019; H01L 51/003
USPC .................................. 257/40; 438/34, 66, 29
See application file for complete search history.

(56) References Cited

U.S. PATENT DOCUMENTS 6,337,166 B1 *   1/2002   Chambers et al. ........... 430/59.6
7,622,738 B2    11/2009   Oh et al.
(Continued)

FOREIGN PATENT DOCUMENTS

CN            1867218 A       11/2006
CN          101764090 A        6/2010
(Continued)

OTHER PUBLICATIONS

Chengmei Zeng et al., Materials and Devices toward Fully Solution Processable Organic Light-Emitting Diodes., Chemistry of Materials vol. 23, No. 3, Oct. 21, 2010, pp. 326-340. (cited in the European search report issued by European Patent Office on Sep. 25, 2012 in corresponding European Patent Application No. 12168689.3.).
(Continued)

*Primary Examiner* — Peter Bradford
(74) *Attorney, Agent, or Firm* — Robert E. Bushnell, Esq.

(57) ABSTRACT

An organic light emitting display device includes a hole transport layer (HTL) having a first region and a second region, an emitting layer (EML) disposed on the hole transport layer in the first region, a hydrophobic pattern disposed on the hole transport layer in the second region and an electron transport layer (ETL) disposed on the hydrophobic pattern and the emitting layer.

70 Claims, 13 Drawing Sheets

(51) Int. Cl.
*H01L 51/56* (2006.01)
*H01L 51/50* (2006.01)
*H01L 27/32* (2006.01)

(56) References Cited

U.S. PATENT DOCUMENTS

| | | |
|---|---|---|
| 7,638,358 B2 | 12/2009 | Oh et al. |
| 7,799,597 B2 | 9/2010 | Ahn et al. |
| 8,384,095 B2 | 2/2013 | Lee et al. |
| 2003/0080677 A1* | 5/2003 | Mikhael et al. ............... 313/504 |
| 2005/0282308 A1 | 12/2005 | Uhlig et al. |
| 2006/0087228 A1 | 4/2006 | Kobayashi |
| 2007/0218190 A1* | 9/2007 | Takashima et al. ............ 427/66 |
| 2007/0248746 A1 | 10/2007 | Ito et al. |
| 2008/0074043 A1* | 3/2008 | Kim ............................... 313/504 |
| 2008/0096124 A1* | 4/2008 | Potts et al. .................... 430/200 |
| 2009/0284128 A1 | 11/2009 | Shinohara et al. |
| 2010/0102715 A1 | 4/2010 | Suh |
| 2010/0155760 A1 | 6/2010 | Lee et al. |
| 2010/0213449 A1* | 8/2010 | Yamamoto et al. ............ 257/40 |
| 2010/0295033 A1* | 11/2010 | Rokuhara et al. ............. 257/40 |
| 2011/0127502 A1* | 6/2011 | Kim ............................... 257/40 |
| 2011/0127507 A1 | 6/2011 | Choi et al. |
| 2011/0198598 A1 | 8/2011 | Kim et al. |
| 2011/0220922 A1 | 9/2011 | Kim et al. |
| 2012/0001186 A1* | 1/2012 | Kondoh et al. ................ 257/59 |
| 2012/0032207 A1* | 2/2012 | Nishiyama et al. ............ 257/89 |
| 2012/0319089 A1 | 12/2012 | Shin et al. |
| 2013/0234129 A1* | 9/2013 | Yamada et al. ................ 257/40 |

FOREIGN PATENT DOCUMENTS

| | | | |
|---|---|---|---|
| CN | 202930434 | U | 5/2013 |
| EP | 2 202 817 | A1 | 6/2010 |
| JP | 2004-146478 | A | 5/2004 |
| JP | 2006-310257 | A | 11/2006 |
| JP | 2009-176700 | A | 8/2009 |
| JP | 2009-238890 | A | 10/2009 |
| JP | 2010-10670 | A | 1/2010 |
| JP | 2010-56012 | A | 3/2010 |
| KR | 1020100045305 | A | 5/2010 |
| KR | 1020100075354 | A | 7/2010 |
| KR | 1020100116844 | A | 11/2010 |
| TW | 201100963 | A | 1/2011 |
| WO | WO 2009/041158 | * | 4/2009 |
| WO | WO 2009/087876 | * | 7/2009 |
| WO | 2011-043083 | A1 | 4/2011 |

OTHER PUBLICATIONS

European search report issued by European Patent Office on Sep. 25, 2012 in corresponding European Patent Application No. 12168689.3.

Chinese Office Action issued on Nov. 4, 2015 for Chinese patent application No. 201210192017.2 and Request for Entry of the Accompanying Office Action attached herewith.

Taiwanese Office Action issued on Nov. 16, 2015 for Taiwanese patent application No. 101118436 and Request for Entry of the Accompanying Office Action attached herewith.

Japanese Office Action issued by Japanese Patent Office on Dec. 1, 2015 for Japanese Patent Application No. 2012-066939 to the above identified application and Request for Entry of the Accompanying Office Action attached herewith.

* cited by examiner

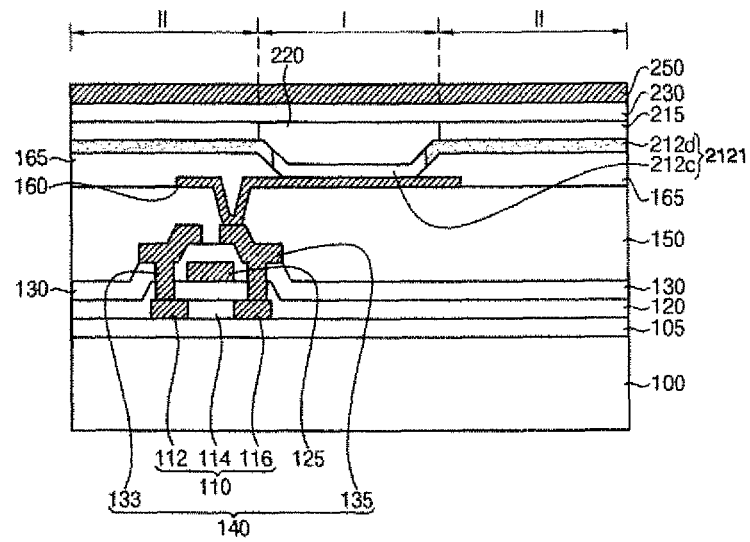
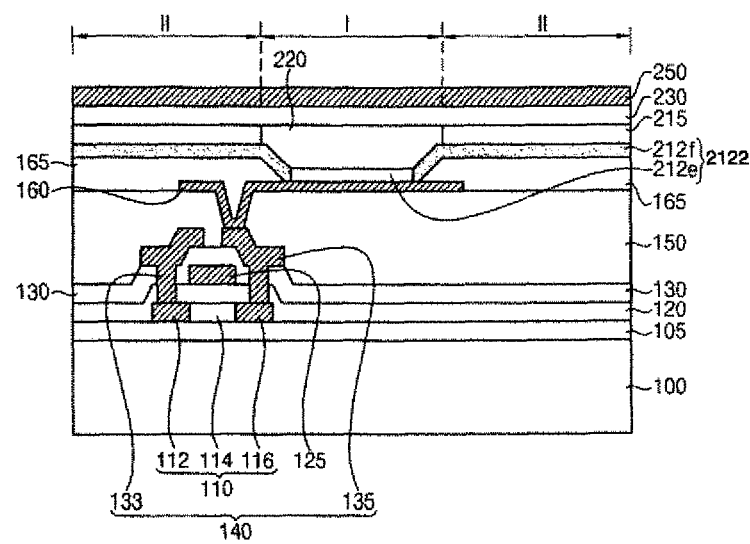

METHOD FOR FORMING OLED DEVICES WITH PATTERNED HOLE OR ELECTRON TRANSPORT LAYERS

CLAIM OF PRIORITY

This application makes reference to, incorporates the same herein, and claims all benefits accruing under 35 U.S.C. §119 from an application earlier filed in the Korean Intellectual Property Office on Jun. 16, 2011 and there duly assigned Serial No. 10-2011-0058265, and an application earlier filed in the Korean Intellectual Property Office on Sep. 9, 2011 and there duly assigned Serial No. 10-2011-0091690.

BACKGROUND OF THE INVENTION

1. Field of the Invention

Exemplary embodiments relate to organic light emitting structures, methods of forming organic light emitting structures, organic light emitting display devices and methods of manufacturing organic light emitting devices. More particularly, Exemplary embodiments relate to organic light emitting structures including hydrophobic patterns, methods of forming organic light emitting structures including hydrophobic patterns, organic light emitting display devices including hydrophobic patterns and methods of manufacturing organic light emitting devices including hydrophobic patterns.

2. Description of the Related Art

An organic light emitting display (OLED) device may display desired information such as images, letters and/or characters using a light generated by the combination of holes provided from an anode and electrons provided from a cathode in an organic layer thereof. The OLED device may have several advantages such as wide viewing angle, high response time, exceptional thinness and overall compactedness, and low power consumption, so that the OLED device may be widely employed in various electrical and electronic apparatuses. Recently, the OLED device has been rapidly developed as one of the most promising class of display devices.

To form an organic emitting layer of the OLED device, a printing process using an inkjet, a spinner or a nozzle, a patterning process after the deposition of layers, and a transfer process using heat or laser have been utilized. The organic emitting layer, however, may not be formed uniformly within a pixel region of the OLED device and may not be endowed with a capability to visually display high contrast images when fabricated by the above-mentioned process techniques. Additionally, as the size of the OLED device increases, a mask used for, e.g., an exposure process may not be easily obtained and a large quantity of materials for forming the organic emitting layer may be required, thereby unnecessarily inflating the cost of manufacturing.

SUMMARY OF THE INVENTION

Exemplary embodiments fabricated in conformance with the principles of the present invention may provide an improved organic light emitting structure and a method for forming the same.

Exemplary embodiments provide an organic light emitting structure including a hydrophobic pattern to ensure improved luminescence characteristics.

Exemplary embodiments provide a method of forming an organic light emitting structure including a hydrophobic pattern to ensure improved luminescence characteristics.

Exemplary embodiments provide an organic light emitting display device including a hydrophobic pattern to have improved luminescence characteristics.

Exemplary embodiments provide a method of manufacturing an organic light emitting display device including a hydrophobic pattern to have improved luminescence characteristics.

According to exemplary embodiments, there is provided an organic light emitting structure. The organic light emitting structure may include a hole transport layer (HTL) having a first region and a second region, an emitting layer (EML) disposed on the hole transport layer in the first region, a hydrophobic pattern disposed on the hole transport layer in the second region and an electron transport layer (ETL) disposed on the hydrophobic pattern and the emitting layer.

In exemplary embodiments, the first region may substantially correspond to a pixel region and the second region may substantially correspond to a non-pixel region.

In exemplary embodiments, the emitting layer may be substantially confined by the hydrophobic pattern.

In exemplary embodiments, a hole injection layer (HIL) may be further disposed beneath the hole transport layer.

In exemplary embodiments, an electron injection layer (EIL) may be further disposed on the electron transport layer.

In Exemplary embodiments, the hydrophobic pattern may include at least one fluorine-based material, e.g., polymer, oligomer, dendrimer and monomer containing at least one carbon atom combined or hybridized with at least one fluorine atom, or may include at least one organosilane-based material containing at least one organic functional group combined with a silicon atom.

In exemplary embodiments, the fluorine-based material may have a repeating unit represented by a formula of $-(CF_2-CF_2)n-$.

In exemplary embodiments, the organosilane-based material may be represented by a following chemical formula.

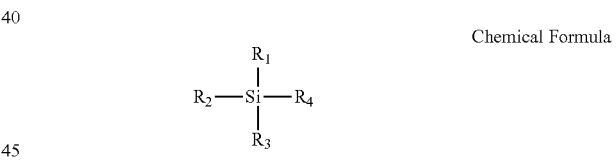

Chemical Formula

In the above chemical formula, $R_1$ to $R_4$ may independently represent hydrogen, a $C_1$ to $C_{20}$ alkyl group, a $C_1$ to $C_{20}$ alkoxy group, halogen, an amino group or a hydroxyl group. At least one of $R_1$ to $R_4$ may represent a $C_1$ to $C_{20}$ alkyl group or a $C_1$ to $C_{20}$ alkoxy group.

In exemplary embodiments, the $C_1$ to $C_{20}$ alkyl group or the $C_1$ to $C_{20}$ alkoxy group may have at least one fluorine atom substituent.

In exemplary embodiments, the hydrophobic pattern may have a thickness of about 1000 Å to about 3 μm.

In exemplary embodiments, the hole transport layer may include a first pattern located in the first region and a second pattern located in the second region.

In exemplary embodiments, the first pattern may include a hole transport material, and the second pattern may include the hole transport material and a cross-linked or polymerized photosensitive material.

In exemplary embodiments, the second pattern may have an electrical conductivity substantially lower than that of the first pattern.

In exemplary embodiments, the photosensitive material may include an acrylate-based material or a methacrylate-based material.

In exemplary embodiments, the electron transport layer may include a third pattern and a fourth pattern. The third pattern and the fourth pattern may substantially overlap the first region and the second region, respectively.

In exemplary embodiments, the third pattern may include an electron transport material. The fourth pattern may include an electron transport material and a cross-linked or polymerized photosensitive material.

In exemplary embodiments, the fourth pattern may have an electrical conductivity substantially lower than that of the third pattern.

According to exemplary embodiments, there is provided an organic light emitting display device. The organic light emitting device may include a first substrate having a pixel region and a non-pixel region, a first electrode disposed on the first substrate, a pixel defining layer (PDL) disposed on the first substrate and partially exposing the first electrode in the pixel region, a hole transport layer disposed on the pixel defining layer and the exposed first electrode, a hydrophobic pattern disposed on the hole transport layer in the non-pixel region, an emitting layer disposed on the hole transport layer in the pixel region, an electron transport layer disposed on the hydrophobic pattern and the emitting layer, and a second electrode disposed on the electron transport layer.

In exemplary embodiments, a switching device may be further disposed on the first substrate. The switching device may be electrically connected to the first electrode.

In exemplary embodiments, a hole injection layer may be further disposed on the pixel defining layer and the exposed first electrode, and beneath the hole transport layer.

In exemplary embodiments, an electron injection layer may be further disposed between the electron transport layer and the second electrode.

In exemplary embodiments, the pixel defining layer may have a thickness of about 1000 Å to about 4000 Å.

In exemplary embodiments, the hole transport layer may include a first pattern and a second pattern. The second pattern may have an electrical conductivity substantially lower than that of the first pattern.

In exemplary embodiments, the first pattern may be disposed on the exposed first electrode and a sidewall of the pixel defining layer. In this case, the second pattern may be disposed on a surface of the pixel defining layer.

In exemplary embodiments, the first pattern may be disposed on the exposed first electrode and a portion of a sidewall of the pixel defining layer. In this case, the second pattern may be disposed on a surface of the pixel defining layer and on a portion of the sidewall of the pixel defining layer not covered by the first pattern.

In exemplary embodiments, the first pattern may be disposed on the exposed first electrode and the second pattern may be disposed on a surface and a sidewall of the pixel defining layer.

In exemplary embodiments, the first pattern may be disposed on a portion of the exposed first electrode and the second pattern may be disposed on the pixel defining layer and on a portion of the exposed first electrode not covered by the first pattern.

In exemplary embodiments, the electron transport layer may include a third pattern and a fourth pattern. The fourth pattern may have an electrical conductivity substantially lower than that of the third pattern.

In exemplary embodiments, the third pattern may be disposed on the emitting layer and the fourth pattern may be disposed on the hydrophobic pattern.

In exemplary embodiments, the third pattern may be disposed on a portion of the emitting layer. In this case, the fourth pattern may be disposed on the hydrophobic pattern and on a portion of the emitting layer not covered by the third pattern.

According to exemplary embodiments, there is provided a method of forming an organic light emitting structure. In the method, a hole transport layer having a first region and a second region may be provided. A hydrophobic pattern may be formed on the hole transport layer in the second region. An emitting layer may be formed on the hole transport layer in the first region. An electron transport layer may be formed on the hydrophobic pattern and the emitting layer.

In exemplary embodiments, in forming the hydrophobic pattern, a hydrophobic layer may be formed on a donor substrate. The donor substrate may be arranged over the hole transport layer so that the hydrophobic layer may face the hole transport layer. A laser beam may be irradiated selectively in the second region to transfer a portion of the hydrophobic layer onto the hole transport layer.

In exemplary embodiments, in forming the hydrophobic pattern, a hydrophobic layer may be formed on a donor substrate. The donor substrate may be arranged on the hole transport layer so that the hydrophobic layer may face the hole transport layer. A pressure and a heat may be applied onto the donor substrate to form the hydrophobic pattern on the hole transport layer in the second region.

In exemplary embodiments, the hydrophobic pattern may be formed by an inkjet printing process, a nozzle printing process, a stamping process, an offset imprinting process or a reverse offset imprinting process.

In exemplary embodiments, the hydrophobic pattern may be formed by a soluble process. In the soluble process, a hydrophobic composition may be provided on the hole transport layer in the second region. The hydrophobic composition may include a fluorine-based material or an organosilane-based material and a solvent.

In exemplary embodiments, the hydrophobic pattern may be formed by an insoluble process. In the insoluble process, a fluorine-based material or an organosilane-based material may be vaporized or sublimated. The fluorine-based material or the organosilane-based material may be provided on the hole transport layer in the second region.

In exemplary embodiments, in providing the hole transport layer, a preliminary hole transport layer including a photosensitive composition may be provided. A portion of the preliminary hole transport layer in the second region may be selectively exposed to light.

In exemplary embodiments, the photosensitive composition may include a hole transport material, a photosensitive monomer, a photopolymerization initiator and an organic solvent.

In exemplary embodiments, the portion of the preliminary hole transport layer in the second region may be transformed into a second pattern by a cross-linking reaction or a polymerization. A portion of the preliminary hole transport layer in the first region may be transformed into a first pattern.

In exemplary embodiments, the first pattern may include the hole transport material, and the second pattern may include the hole transport material and a polymer produced by cross-linking or polymerizing the photosensitive monomer.

In exemplary embodiments, a baking process may be further performed after selectively exposing the portion of the preliminary hole transport layer in the second region to light.

In exemplary embodiments, the photosensitive monomer, the photopolymerization initiator and the organic solvent remaining in the first pattern may be removed by providing a developing solution after selectively exposing the portion of the preliminary hole transport layer in the second region to a light.

In exemplary embodiments, in the formation of the electron transport layer, a preliminary electron transport layer may be formed on the emitting layer and the hydrophobic pattern. The preliminary electron transport layer may include a photosensitive composition. A portion of the preliminary electron transport layer on the hydrophobic pattern may be selectively exposed to a light.

In exemplary embodiments, the photosensitive composition may include an electron transport material, a photosensitive monomer, a photopolymerization initiator and an organic solvent.

In exemplary embodiments, the portion of the preliminary electron transport layer on the hydrophobic pattern may be transformed into a fourth pattern by a cross-linking reaction or a polymerization. A portion of the preliminary electron transport layer on the emitting layer may be transformed into a third pattern.

In exemplary embodiments, the third pattern may include the electron transport material, and the fourth pattern may include the electron transport material and a polymer produced by cross-linking or polymerizing the photosensitive monomer.

In exemplary embodiments, a baking process may be further performed after selectively exposing the portion of the preliminary electron transport layer on the hydrophobic pattern to the light.

In exemplary embodiments, the photosensitive monomer, the photopolymerization initiator and the organic solvent remaining in the third pattern may be removed by providing a developing solution after selectively exposing the portion of the preliminary electron transport layer on the hydrophobic pattern to a light.

In exemplary embodiments, a hole injection layer may be further provided before providing the hole transport layer.

In exemplary embodiments, an electron injection layer may be further formed on the electron transport layer.

In exemplary embodiments, the hydrophobic pattern may have a thickness of about 1000 Å to about 3 μm.

According to exemplary embodiments, there is provided a method of manufacturing an organic light emitting display device. In the method, a first electrode may be formed on a first substrate. The first substrate may have a pixel region and a non-pixel region. A pixel defining layer may be formed on the first substrate. The pixel defining layer may partially expose the first electrode. A hole transport layer may be formed on the pixel defining layer and the exposed first electrode. A hydrophobic pattern may be formed on the hole transport layer in the non-pixel region. An emitting layer may be formed on the hole transport layer in the pixel region. An electron transport layer may be formed on the hydrophobic pattern and the emitting layer. A second electrode may be formed on the electron transport layer.

In exemplary embodiments, the hydrophobic pattern may be formed using at least one fluorine-based material, e.g., polymer, oligomer, dendrimer and monomer containing at least one carbon atom combined or hybridized with at least one fluorine atom, or may be formed using at least one organosilane-based material containing at least one organic functional group combined with a silicon atom.

In exemplary embodiments, in the formation of the hydrophobic pattern, a hydrophobic layer may be formed on a donor substrate. The donor substrate may be arranged over the hole transport layer so that the hydrophobic layer may face the hole transport layer. A laser beam may be irradiated selectively in the non-pixel region to transfer a portion of the hydrophobic layer onto the hole transport layer.

In exemplary embodiments, in the formation of the hydrophobic pattern, a hydrophobic layer may be formed on a donor substrate. The donor substrate may be arranged on the hole transport layer so that the hydrophobic layer may face the hole transport layer. A pressure and a heat may be applied to the donor substrate to form the hydrophobic pattern on the hole transport layer in the non-pixel region.

In exemplary embodiments, the hydrophobic pattern may be formed by an inkjet printing process, a nozzle printing process, a stamping process, an offset imprinting process or a reverse offset imprinting process.

In exemplary embodiments, the hydrophobic pattern may be formed by a soluble process. In the soluble process, a hydrophobic composition may be provided on the hole transport layer in the non-pixel region. The hydrophobic composition may include a fluorine-based material or an organosilane-based material and a solvent.

In exemplary embodiments, the hydrophobic pattern may be formed by an insoluble process. In the insoluble process, a fluorine-based material or an organosilane-based material may be vaporized or sublimated. The fluorine-based material or the organosilane-based material may be provided on the hole transport layer in the non-pixel region.

In exemplary embodiments, in the formation of the hole transport layer, a preliminary hole transport layer including a photosensitive composition may be formed on the pixel defining layer and the exposed first electrode. A portion of the preliminary hole transport layer on the pixel defining layer may be selectively exposed to a light.

In exemplary embodiments, a portion of the preliminary hole transport layer on a top surface of the pixel defining layer may be transformed into a second pattern by a cross-linking reaction or a polymerization. In this case, a portion of the preliminary hole transport layer on a sidewall of the pixel defining layer and the exposed first electrode may be transformed into a first pattern.

In exemplary embodiments, a portion of the preliminary hole transport layer on a surface and a portion of a sidewall of the pixel defining layer may be transformed into a second pattern by a cross-linking reaction or a polymerization. In this case, a portion of the preliminary hole transport layer on the sidewall of the pixel defining layer not covered by the second pattern and on the exposed first electrode may be transformed into a first pattern.

In exemplary embodiments, a portion of the preliminary hole transport layer on a surface and a sidewall of the pixel defining layer may be transformed into a second pattern by a cross-linking reaction or a polymerization. In this case, a portion of the preliminary hole transport layer on the exposed first electrode may be transformed into a first pattern.

In exemplary embodiments, a portion of the preliminary hole transport layer on the pixel defining layer and a portion of the exposed first electrode may be transformed into a second pattern by a cross-linking reaction or a polymerization. In this case, a portion of the preliminary hole transport layer on the exposed first electrode not covered by the second pattern may be transformed into a first pattern.

In exemplary embodiments, in the formation of the electron transport layer, a preliminary electron transport layer may be formed on the emitting layer and the hydrophobic pattern. The preliminary electron transport layer may include a photosensitive composition. A portion of the preliminary electron transport layer in the non-pixel region may be selectively exposed to a light.

In exemplary embodiments, a portion of the preliminary electron transport layer on the hydrophobic pattern may be transformed into a fourth pattern by a cross-linking reaction or a polymerization. In this case, a portion of the preliminary electron transport layer on the emitting layer may be transformed into a third pattern.

In exemplary embodiments, a portion of the preliminary electron transport layer on the hydrophobic pattern and a portion of the emitting layer may be transformed into a fourth pattern by a cross-linking reaction or a polymerization. In this case, a portion of the preliminary electron transport layer on the emitting layer not covered by the fourth pattern may be transformed into a third pattern.

In exemplary embodiments, a hole injection layer may be further formed on the pixel defining layer and the exposed first electrode before forming the hole transport layer.

In exemplary embodiments, an electron injection layer may be further formed on the electron transport layer after forming the electron transport layer.

According to exemplary embodiments, an organic light emitting display device may include a hydrophobic pattern on a portion of a hole transport layer in a non-pixel region. A portion of the hole transport layer in a pixel region may have a hydrophilicity so that an organic emitting layer may be formed selectively in the pixel region. Accordingly, a light emitting material of the organic emitting layer may be prevented from being deposited on the non-pixel region and blurring or smearing the non-pixel region, so that the organic light emitting display device may have improved resolution and contrast. Additionally, an electrical conductivity of the hole transport layer in the non-pixel region may be reduced so that luminescence characteristics of the organic light emitting display device may be more enhanced.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 2A to 2D are cross-sectional views illustrating organic light emitting display devices including organic light emitting structures constructed as some exemplary embodiments according to the principles of the present invention;

DETAILED DESCRIPTION OF THE INVENTION

Figure 1:
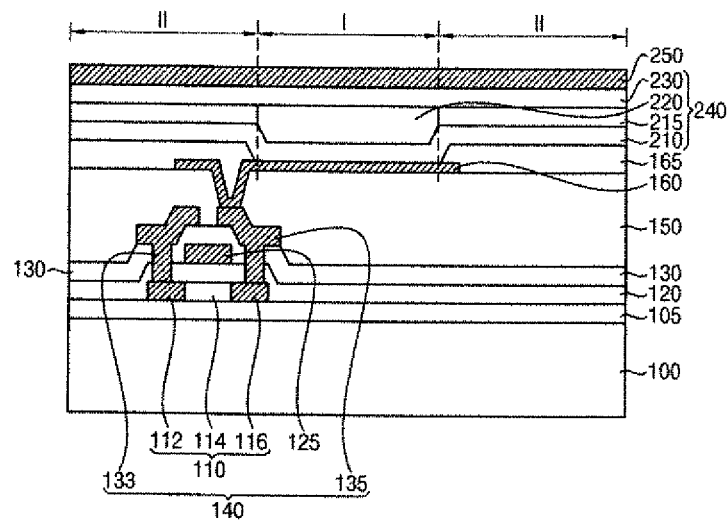
FIG. 1 is a cross-sectional view illustrating an organic light emitting display device including an organic light emitting structure constructed as an exemplary embodiment according to the principles of the present invention.

Various exemplary embodiments will be described more fully hereinafter with reference to the accompanying drawings, in which some exemplary embodiments are shown. The invention may, however, be embodied in many different forms and should not be construed as limited to the exemplary embodiments set forth herein. Rather, these exemplary embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating an organic light emitting display device including an organic light emitting structure constructed as an embodiment in accordance with the principles of the present invention.

Referring to FIG. 1, the organic light emitting display (OLED) device may include a first substrate 100, a switching device 140, a first electrode 160, an organic light emitting structure 240, a second electrode 250, etc.

The first substrate 100 may include a transparent substrate such as a glass substrate, a quartz substrate, a transparent plastic substrate, etc. For example, the transparent plastic substrate may include polyimide, acryl-based resin, polyethylene terephthalate (PET), polycarbonate, polyacrylate, polyether, etc. In one exemplary embodiment, a planarization process may be performed on the first substrate 100 so that the first substrate 100 may have a substantially planar top surface. For example, the planarization process may include a chemical mechanical polishing (CMP) process or an etch-back process.

In exemplary embodiments, a buffer layer 105 may be disposed on the first substrate 100. The buffer layer 105 may block the diffusion of impurities generated from the first substrate 100 and may control a heat transfer when a semiconductor pattern 110 may be formed by a crystallization process. For example, the buffer layer 105 may include silicon oxide (SiOx), silicon nitride (SiNx), silicon oxynitride (SiOxNy), etc. The buffer layer 105 may have a single-layered structure or a multi-layered structure including these materials. In one exemplary embodiment, the OLED device may not include the buffer layer 105.

The switching device 140 may be disposed on the buffer layer 105. The switching device 140 may include the semiconductor pattern 110, a gate electrode 125, a gate insulation layer 120, a source electrode 133 and a drain electrode 135, etc. In exemplary embodiments, the switching device 140 may include a thin film transistor (TFT) having an active region of polysilicon. Alternatively, the switching device 140 may include an oxide semiconductor device. In this case, the switching device 140 may include a gate electrode on the buffer layer 105, a gate insulation layer covering the gate electrode, a source electrode at one side of the gate insulation layer, a drain electrode at the other side of the gate insulation layer, an active layer having an oxide semiconductor material and being disposed on the source electrode, the drain electrode and the gate insulation layer, etc.

Referring now to FIG. 1, the semiconductor pattern 110 may include a source region 112 connected to the source electrode 133, a drain region 116 connected to the drain electrode 135 and a channel region 114 between the source region 112 and the drain region 116. In exemplary embodiments, the semiconductor pattern 110 may include polysilicon.

The gate insulation layer 120 may be disposed on the buffer layer 105 to cover the semiconductor pattern 110. The gate insulation layer 120 may insulate the gate electrode 125 from the semiconductor pattern 110. In exemplary embodiments, the gate insulation layer 120 may include a silicon-based compound, e.g., silicon oxide, silicon nitride, silicon oxynitride, etc. These may be used alone or in a mixture thereof. In one exemplary embodiment, the gate insulation layer 120 may include a metal oxide. For example, the gate insulation layer 120 may include aluminum oxide (AlOx), zirconium oxide (ZrOx), hafnium oxide (HfOx), tantalum oxide (TaOx), etc. These may be used alone or in a mixture thereof. The gate insulation layer 120 may have a single-layered structure or a multi-layered structure including the above silicon-based compounds and/or the metal oxides.

The gate electrode 125 to which a gate signal is applied may be disposed on the gate insulation layer 120. The gate electrode 125 may include a metal such as chromium (Cr), aluminum (Al), tantalum (Ta), molybdenum (Mo), titanium (Ti), tungsten (W), copper (Cu), silver (Ag), neodymium (Nd), etc., or an alloy of these metals. These may be used alone or in a mixture thereof. A gate line (not illustrated) electrically connected to the gate electrode 125 and extending in a predetermined direction may be disposed on the gate insulation layer 120.

A first insulating interlayer 130 covering the gate electrode 125 may be disposed on the gate insulation layer 120. The first insulating interlayer 130 may include silicon oxide or a transparent insulating material such as acryl-based resin, polyimide-based resin, siloxane-based resin, etc. The first insulating interlayer 130 may insulate the gate electrode 125 from the source and drain electrodes 133 and 135.

The source electrode 133 and the drain electrode 135 may be disposed on the first insulating interlayer 130. The source electrode 133 and the drain electrode 135 may be electrically connected to the source region 112 and the drain region 116, respectively, through openings formed in the first insulating interlayer 130 and the gate insulation layer 120. The source electrode 133 and the drain electrode 135 may be positioned symmetrically to each other with respect to the gate electrode 125. The source and drain electrodes 133 and 135 may include a metal such as chromium, aluminum, tantalum, molybdenum, titanium, tungsten, copper, silver, neodymium, etc., or an alloy of these metals.

A second insulating interlayer 150 covering the switching device 140 may be disposed on the first insulating interlayer 130. That is, the second insulating interlayer 150 may cover the source and drain electrodes 133 and 135. The second insulating interlayer 150 may protect the switching device 140 and may insulate the switching device 140 from upper structures. The second insulating interlayer 150 may include a transparent insulating material having a self-planarizing property. For example, the second insulating interlayer 150 may include acryl-based resin, polyimide-based resin, siloxane-based resin, benzocyclobutene (BCB), etc.

The first electrode 160 may be disposed on the second insulating interlayer 150 and may be electrically to the drain electrode 135 through an opening formed in the second insulating interlayer 150. For such electrical connection between the first electrode 160 and the drain electrode 135, the second insulating interlayer 150 may include an opening (not illustrated) or a hole (not illustrated) at least partially exposing the drain electrode 135. In exemplary embodiments, the first electrode 160 may fill up the opening or the hole and may extend on a top surface of the second insulating interlayer 150. In one exemplary embodiment, the first electrode 160 may partially fill the opening or the hole and may extend on the top surface of the second insulating interlayer 150. In this case, the first electrode 160 may be formed uniformly on a sidewall of the opening or the hole.

The first electrode 160 may serve as a transparent electrode or a reflective electrode according to the types of the OLED device, for example, a top-emission type or a back-emission type. When the first electrode 160 serves as the transparent electrode, the first electrode 160 may include a transparent conductive material, for example, indium tin oxide (ITO), zinc tin oxide (ZTO), indium zinc oxide (IZO), zinc oxide (ZnOx), tin oxide (SnOx), etc. In case that the first electrode 160 serves as the reflective electrode, the first electrode 160 may include a metal such as silver (Ag), aluminum (Al), platinum (Pt), gold (Au), chromium (Cr), tungsten (W), molybdenum (Mo), titanium (Ti), palladium (Pd), etc., or an alloy of these metals. In one exemplary embodiment, the first electrode 160 may have a multi-stacked structure including a first layer and a second layer. The first layer may include, e.g., the above metal or the alloy and the second layer may include, e.g., the above transparent conductive material.

As illustrated in FIG. 1, a pixel defining layer (PDL) 165 may be disposed on the second insulating interlayer 150 and the first electrode 160. The PDL 165 may partially expose the first electrode 160 to define a first region I of the OLED device. The first region I may correspond to a pixel region of the OLED device. In exemplary embodiments, the PDL 165 may include a photosensitive material, for example, polyimide-based resin or acryl-based resin. Alternatively, the PDL 165 may include a non-photosensitive material or an inorganic material.

In exemplary embodiments, the PDL 165 may have a thickness of about 1000 Å to about 4000 Å.

The organic light emitting structure 240 may be disposed on the first electrode 160 and the PDL 165. In exemplary embodiments, the organic light emitting structure 240 may include a hole transport layer (HTL) 210, a hydrophobic pattern 215, an organic light emitting layer (EML) 220 and an electron transport layer (ETL) 230 sequentially stacked on the first electrode 160 and the PDL 165.

The HTL 210 may be disposed on the PDL 165 and a portion of the first electrode 160 exposed by the PDL 165. The HTL 210 may include a hole transport material. Non-limiting examples of the hole transport material may include 4,4-bis[N-(1-naphtyl)-N-phenylamino]biphenyl (NPB), N,N-diphenyl-N,N-bis(3-methyl phenyl)-1,1-biphenyl-4,4-diamine (TPD), N,N-di-1-naphtyl-N,N-diphenyl-1,1-biphenyl-4,4-diamine (NPD), N-phenylcarbazole, polyvinylcarbazole or a mixture of these materials.

In one exemplary embodiment, a hole injection layer (HIL) (not illustrated) may be located on the PDL 165 and the exposed first electrode 160, and beneath the HTL 210. The HIL may include, e.g., 4,4',4"-tris(N-carbazolyl)triphenylamine (TCTA), 4,4',4"-tris(N-(3-methylphenyl)-N-phenylamino)triphenylamine (m-MTDATA), 1,3,4-tris{4-[methylphenyl(phenyl)amino]phenyl}benzene (m-MTDAPB), 4,4',4"-tris(2-naphthylphenylamino)triphenylamine (2-TNATA), or a mixture of these materials.

The hydrophobic pattern 215 may be disposed on a portion of the HTL 165 in a second region II in which the PDL 165 and the portion of the HTL 165 may substantially overlap each other. The second region II may correspond to a non-pixel region of the OLED device. The second region II (non-pixel region) of the OLED device may have a hydrophobic surface by forming the hydrophobic pattern 215. In exemplary embodiments, the hydrophobic pattern 215 may have a thickness of about 1000 Å to about 3 μm.

In exemplary embodiments, the hydrophobic pattern 215 located in the second region II may include a fluorine-based material. The fluorine-based material may include at least one of polymer, oligomer, dendrimer or monomer containing at least one carbon atom combined or hybridized with at least one fluorine atom. These may be used alone or in a mixture thereof. The carbon atom may be combined with one fluorine atom ($CF_1$), two fluorine atoms ($CF_2$) or three fluorine atoms ($CF_3$). In one exemplary embodiment, the hydrophobic pattern 215 may include a fluorine-based polymer having a repeating unit represented by —($CF_2$—$CF_2$)n-. Here, n may be an integer in a range of about 2 to 10,000.

In some exemplary embodiments, the hydrophobic pattern 215 may include an organosilane-based material having at least one organic functional group combined with a silicon atom. The organic functional group may include alkyl, alkoxy, halogen, amino, hydroxyl, etc. For example, the organosilane-based material may be represented by a following chemical formula.

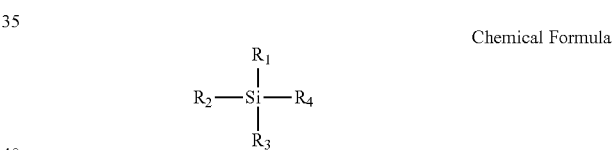

Chemical Formula

In the above chemical formula, $R_1$ to $R_4$ may independently represent hydrogen, a $C_1$ to $C_{20}$ alkyl group, a $C_1$ to $C_{20}$ alkoxy group, halogen, an amino group or a hydroxyl group. In exemplary embodiments, at least one of $R_1$ to $R_4$ may be a $C_1$ to $C_{20}$ alkyl group or a $C_1$ to $C_{20}$ alkoxy group. Additionally, the $C_1$ to $C_{20}$ alkyl group or the $C_1$ to $C_{20}$ alkoxy group may be substituted with at least one fluorine atom.

The hydrophobic pattern 215 may include the fluorine-based material or the organosilane-based material so that a difference of surface energy may be generated between the hydrophobic pattern 215 and the HTL 210. Accordingly, the EML 220 may be formed selectively in the first region I substantially corresponding to the pixel region.

The EML 220 may be disposed on a portion of the HTL 210 located in the first region I of the OLED device. The EML 220 may include at least one of light emitting materials for generating different colors of light, for example, a red color of light, a green color of light or a blue color of light. The EML 220 may include a mixture or a combination of the light emitting materials for generating a white color of light. The EML 220 may further include a host material having a relatively large band gap.

According to exemplary embodiments, the EML 220 may be disposed selectively in the first region I (pixel region) confined by the hydrophobic pattern 215. Thus, the light emitting materials may be prevented from being deposited or diffused onto the second region II (non-pixel region) and from blurring or smearing the non-pixel region, so that the EML 220 may be precisely formed in the pixel region with a high resolution. As a result, the OLED device may have an enhanced contrast.

Referring now to FIG. 1, the ETL 230 may be disposed on the hydrophobic pattern 215 and the EML 220. For example, the ETL 230 may include, but not limited to, tris(8-quinolinolate)aluminum (Alq), 2-(4-biphenylyl)-5-(4-tert-butyl phenyl)-1,3,4-oxadiazole (PBD), 3-(4-tert-butylphenyl)-4-phenyl-5-(4-biphenylyl)-1,2,4-triazole (TAZ), 5,6,11,12-tetraphenylnaphthacene (rubrene), etc.

The second electrode 250 may be disposed on the ETL 230. The second electrode 250 may serve as a reflective electrode or a transparent electrode. When the second electrode 250 serves as the reflective electrode, the second electrode 250 may include a metal or a metal compound such as lithium (Li), calcium (Ca), lithium fluoride/calcium (LiF/Ca), lithium fluoride/aluminum (LiF/Al), aluminum (Al), magnesium (Mg), silver (Ag), chromium (Cr), tungsten (W), molybdenum (Mo), titanium, (Ti), etc., or an alloy of these metals. In case that the second electrode 250 serves as the transparent electrode, the second electrode 250 may include a transparent conductive material, e.g., indium tin oxide, zinc tin oxide, indium zinc oxide, zinc oxide, tin oxide, etc. In one exemplary embodiment, the second electrode 250 may have a multi-stacked structure including a first layer and a second layer. The first layer may include, e.g., the above metal and/or the alloy, and the second layer may include, e.g., the above transparent conductive material.

In one exemplary embodiment, an electron injection layer (EIL) may be further disposed between the ETL 230 and the second electrode 250. The EIL may include an alkaline metal, an alkaline earth metal, fluorides of these metals, oxides of these metals, etc. These may be used alone or in a mixture thereof.

A protection layer (not illustrated) and a second substrate (not illustrated) may be sequentially disposed on the second electrode 250. The protection layer may include a transparent insulating material and the second substrate may include a transparent insulating substrate.

FIGS. 2A to 2D are cross-sectional views illustrating organic light emitting display devices including organic light emitting structures constructed as some exemplary embodiments according to the principles of the present invention. The OLED devices of FIGS. 2A to 2D may have constructions substantially similar to that illustrated in FIG. 1.

As illustrated in FIGS. 2A to 2D, the OLED devices may include a switching device 140, a first insulating interlayer 130, a second insulating interlayer 150, a first electrode 160, a PDL 165, an organic light emitting structure, a second electrode 250, etc., on a first substrate 100. Elements including the first substrate 100, the switching device 140, the first insulating interlayer 130, the second insulating interlayer 150, the first electrode 160, the PDL 165 and the second electrode 250 may have structures substantially the same as or similar to those illustrated with reference to FIG. 1. Thus, detailed descriptions thereof are omitted.

Figure 2A:
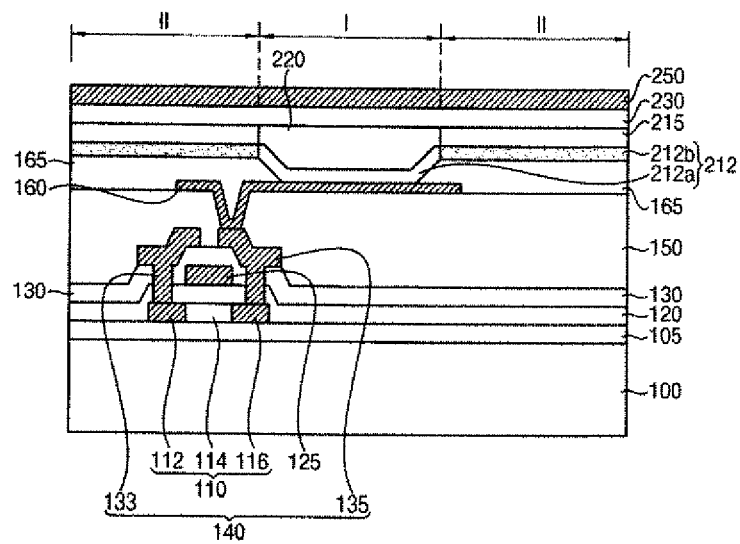

Referring to FIG. 2A, the organic light emitting structure may include an HTL 212, a hydrophobic pattern 215, an EML 220 and an ETL 230. The hydrophobic pattern 215, the EML 220 and the ETL 230 may have structures substantially the same as or similar to those illustrated with reference to FIG. 1. Thus, detailed descriptions thereof are omitted.

The HTL 212 may be disposed on the PDL 165 and the first electrode 160. The HTL 212 may include a first pattern 212a substantially located in a first region I (a pixel region) and a second pattern 212b substantially located in a second region II (a non-pixel region). That is, the first pattern 212a of the HTL 212 may be located on a portion of the first electrode 160 exposed by the PDL 165 and on a sidewall of the PDL 165. The second pattern 212b of the HTL 212 may be located on a top surface of the PDL 165 in the second region II.

The first pattern 212a may include a hole transport material, e.g., NPB, TPD, α-NPD, N-phenylcarbazole, polyvinylcarbazole, etc. The second pattern 212b may include a cross-linked or polymerized photosensitive material in addition to the above hole transport material. The second pattern 212b may have a relatively low electrical conductivity by the cross-linked or polymerized photosensitive material.

Referring to FIG. 2B, an HTL 2121 may include a first pattern 212e containing the hole transport material and a second pattern 212d containing the hole transport material and the cross-linked or polymerized photosensitive material. The second pattern 212d may extend from the top surface of the PDL 165 to a portion of the sidewall of the PDL 165. In this case, the first pattern 212c may be located on the exposed first electrode 160 and on a remaining portion of the sidewall of the PDL 165 not covered by the second pattern 212d.

Referring to FIG. 2C, a second pattern 212f of the HTL 2122 may be located on the top surface and the sidewall of the PDL 165. In this case, a first pattern 212e may be located on the exposed first electrode 160.

Figure 2D:
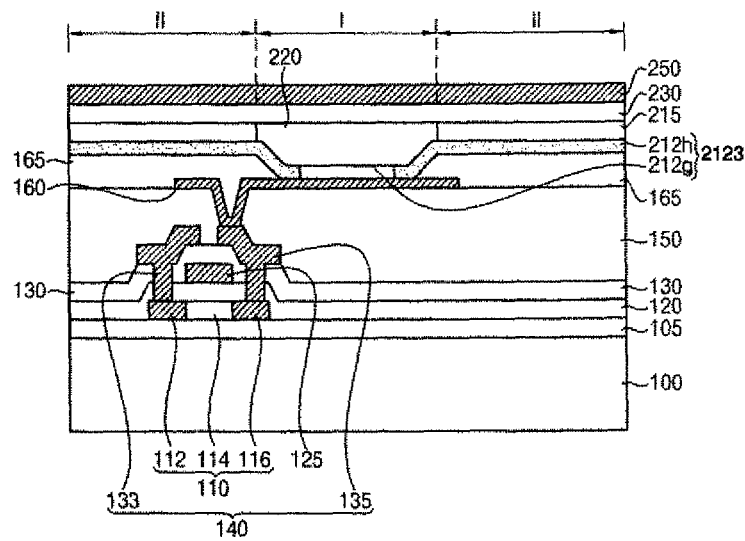

Referring to FIG. 2D, a second pattern 212h of the HTL 2123 may extend from the top surface of the PDL 165 to a portion of the exposed first electrode 160. In this case, a first pattern 212g may be located on a remaining portion of the exposed first electrode 160 not covered by the second pattern 212h.

As illustrated in FIGS. 2A to 2D, regions on which the second patterns 212b, 212d, 212f and 212h having a reduced electrical conductivity are formed may be adjusted so that a region to which holes are transported may be confined properly. This may lead to a synergetic effect together with the hydrophobic pattern 215 limiting a region for the EML 220 so that the OLED device may have more enhanced resolution and contrast.

In one exemplary embodiment, an HIL (not illustrated) may be located beneath the HTL 210 and on the PDL 165 and the exposed first electrode 160, and the HTL 212 may be disposed on the HIL. The HIL may include, e.g., TCTA, m-MTDATA, m-MTDAPB, 2-TNATA or a mixture of these materials.

The hydrophobic pattern 215 and the EML 220 may be disposed on the HTL 212. The hydrophobic pattern 215 may be disposed in the non-pixel region and the EML 220 may be disposed in the pixel-region. The EML 215 may be confined by the hydrophobic pattern 215 to be located selectively in the pixel-region.

The ETL 230 and the second electrode 250 may be sequentially disposed on the EML 220. In one exemplary embodiment, an EIL may be further disposed between the ETL 230 and the second electrode 250. In exemplary embodiments, a protection layer (not illustrated) and a second substrate (not illustrated) may be disposed on the second electrode 250.

Figure 3:
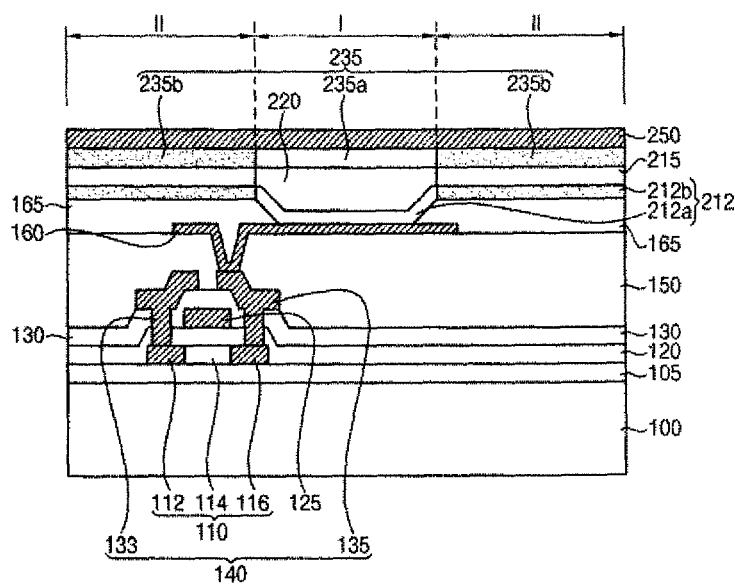
FIG. 3 is a cross-sectional view illustrating an organic light emitting display device including an organic light emitting structure constructed as an exemplary embodiment according to the principles of the present invention.

FIG. 3 is a cross-sectional view illustrating an organic light emitting display device including an organic light emitting structure constructed as an exemplary embodiment according to the principles of the present invention. The OLED device of FIG. 3 may have a construction substantially the same as or similar to that illustrated with reference to FIGS. 2A to 2D except for an organic light emitting structure.

Referring to FIG. 3, an ETL 235 of the organic light emitting structure may include a third pattern 235a located in a first region I and a fourth pattern 235b located in a second region II. The first region I and the second region II may substantially correspond to a pixel region and a non-pixel region, respectively. That is, the third pattern 235a and the fourth pattern 235b may be disposed on an EML 220 and a hydrophobic pattern 215, respectively. The organic light emitting structure of FIG. 3 may have a construction substantially the same as or similar to that illustrated with reference to FIGS. 2A to 2D except for a structure of the ETL 235.

The third pattern 235a of the ETL 235 may include an electron transport material such as Alq, PBD, TAZ, rubrene, etc. The fourth pattern 235b may include a cross-linked or polymerized photosensitive material in addition to the above electron transport material. The fourth pattern 235b may have a relatively low electrical conductivity by the cross-linked or polymerized photosensitive material.

In some exemplary embodiments, the fourth pattern 235b may extend from the hydrophobic pattern 215 to a portion of the EML 220. In this case, the third pattern 235a may be located on a remaining portion of the EML 220 not covered by the fourth pattern 235b. That is, a region on which the fourth pattern 235b is formed may be adjusted so that a region to which electrons are transported may be confined properly.

FIGS. 4 to 11 are cross-sectional views illustrating a method of manufacturing an organic light emitting display device including an organic light emitting structure as exemplary embodiments in accordance with the principles of the present invention.

Figure 4:
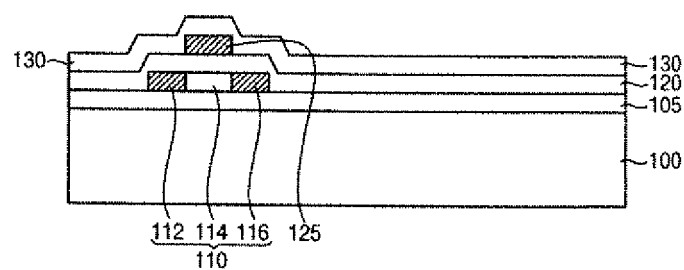
FIGS. 4 to 11 are cross-sectional views illustrating a method of manufacturing an organic light emitting display device including an organic light emitting structure as an exemplary embodiment according to the principles of the present invention.

Referring to FIG. 4, a semiconductor pattern 110 and a gate insulation layer 120 may be formed on a first substrate 100. The first substrate 100 may include a glass substrate, a quartz substrate, a transparent plastic substrate, etc.

In exemplary embodiments, a buffer layer 105 may be formed on the first substrate 100, and the semiconductor pattern 110 may be formed on the buffer layer 105. The buffer layer 105 may be formed using silicon nitride, silicon oxide, silicon oxynitride, etc. The buffer layer 105 may be obtained by a chemical vapor deposition (CVD) process, a plasma enhanced chemical vapor deposition (PECVD) process, a high density plasma-chemical vapor deposition (HDP-CVD) process, etc. The buffer layer 105 may have a single-layered structure or a multi-layered structure including silicon nitride, silicon oxide and/or silicon oxynitride.

In exemplary embodiments, a preliminary semiconductor pattern (not illustrated) may be formed on the buffer layer 105, and then the preliminary semiconductor pattern may be crystallized to obtain the semiconductor pattern 110. The preliminary semiconductor pattern may be formed using amorphous silicon. The preliminary semiconductor pattern may be obtained by a sputtering process, a CVD process, a low pressure chemical vapor deposition (LPCVD) process, a vacuum evaporation process, etc. In one exemplary embodiment, a heat treatment may be further performed about the semiconductor pattern 110 to remove hydrogen contained in the preliminary semiconductor pattern or the semiconductor pattern 110.

As described above, the preliminary semiconductor pattern may be transformed into the semiconductor pattern 100 including polysilicon by a crystallization process. In exemplary embodiments, the crystallization process may include a rapid thermal annealing (RTA) process, solid phase crystallization (SPC) process, a metal induced crystallization (MIC) process, a metal induced lateral crystallization (MILC) process, a super grain silicon (SGS) process, an eximer laser crystallization (ELA) process, a sequential lateral solidification (SLS) process, etc.

In one exemplary embodiment, the crystallization of the preliminary semiconductor pattern may be facilitated by using a metal catalyst, e.g., nickel (Ni), palladium (Pd), iron (Fe), tin (Sn), platinum (Pt).

To control a threshold voltage of a switching device of the OLED device, N-type or P-type impurities may be implanted into the preliminary semiconductor pattern and/or the semiconductor pattern 110.

The gate insulation layer 120 covering the semiconductor pattern 110 may be formed on the buffer layer 105. For example, the gate insulation layer 120 may be formed using silicon oxide or a metal oxide. The gate insulation layer 120 may be obtained by a CVD process, a PECVD process, an ALD process, a sputtering process, a vacuum evaporation process, etc. The gate insulation layer 120 may have a single-layered structure or a multi-layered structure including silicon oxide and/or the metal oxide.

The gate electrode 125 may be formed on the gate insulation layer 120. In exemplary embodiments, a first conductive layer (not illustrated) may be formed on the gate insulation layer, and then the first conductive layer may be patterned by a photolithography process or an etching process using an additional etching mask to form the gate electrode 125. The first conductive layer may be formed using a metal such as chromium, aluminum, tantalum, molybdenum, titanium, tungsten, copper, silver, neodymium, etc., or an alloy of these metals. The first conductive layer may be obtained by a sputtering process, a CVD process, an ALD process, a vacuum evaporation process, a printing process, etc. As illustrated in FIG. 4, the gate electrode 125 may be formed to overlap a channel region 114 of the semiconductor pattern 110.

Impurities may be implanted into the semiconductor pattern 110 using the gate electrode 125 as an ion-implantation mask to form a source region 112 and a drain region 116 at the semiconductor pattern 110. A portion of the semiconductor pattern 110 between the source region 112 and the drain region 116 may be defined as the channel region 114. The channel region 114 may substantially overlap the gate electrode 125 formed over the channel region 114.

A first insulating interlayer 130 covering the gate electrode 120 may be formed on the gate insulation layer 120. The first insulating interlayer 130 may be formed using a silicon-based material such as silicon oxide, silicon nitride, silicon oxynitride, etc., or a transparent insulating material. The first insulating interlayer 130 may be obtained by a CVD process, a PECVD process, an HDP-CVD process, a spin coating process, etc. The first insulating interlayer 130 may have a single-layered structure or a multi-layered structure including the silicon-based material and/or the transparent insulating material.

Figure 5:
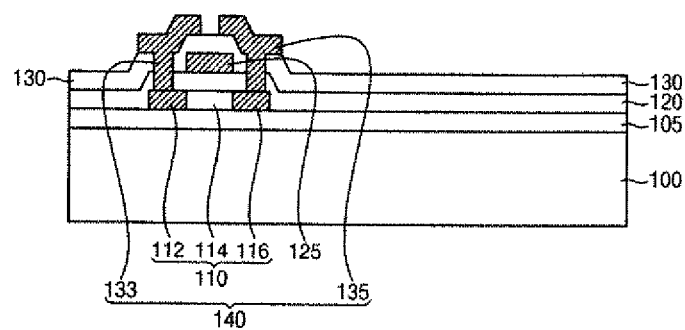

Referring to FIG. 5, a source electrode 133 and a drain electrode 135 electrically connected to the source region 112 and the drain region 116, respectively, may be formed on the first insulating interlayer 130. In exemplary embodiments, the first insulating interlayer 130 and the gate insulation layer 120 may be partially removed to form holes or openings each of which may expose the source region 112 and the drain region 116 of the semiconductor pattern 110. A second conductive layer (not illustrated) filling the holes or the openings may be formed on the first insulating interlayer 130, the source region 112 and the drain region 116. The second conductive layer may be patterned using a photoresist pattern or a mask pattern to form the source electrode 133 and the drain electrode 135 electrically connected to the source region 112 and the drain region 116, respectively. The second conductive layer may be formed using chromium, aluminum, tantalum, molybdenum, titanium, tungsten, copper, silver, neodymium, etc., or an alloy of these metals. The second conductive layer may be obtained by a sputtering process, a CVD process, an ALD process, a vacuum evaporation process, a printing process, etc.

By performing the processes described above, the switching device 140 including the semiconductor pattern 110, the gate insulation layer 120, the gate electrode 125, the source electrode 133 and the drain electrode 135 may be obtained. In exemplary embodiments, the switching device 140 may be a TFT including the semiconductor pattern 110. Alternatively, an oxide semiconductor device may be employed as the switching device 140.

Figure 6:
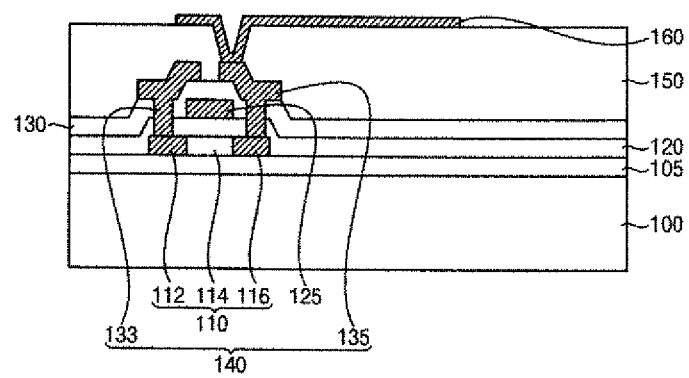

Referring to FIG. 6, a second insulating interlayer 150 covering the switching device 140 may be formed on the first insulating interlayer 130. The second insulating interlayer 150 may be formed using a transparent insulating material, e.g., acryl-based resin, polyimide-based resin, siloxane-based resin, BCB, etc. The second insulating interlayer 150 may be obtained by a spin coating process, a slit coating process, etc. In exemplary embodiments, the second insulating interlayer 150 may be formed using a material having a self-planarizing property. In one exemplary embodiment, a planarization process may be performed on the second insulating interlayer 150 so that the second insulating interlayer 150 may have a substantially level surface.

A first electrode 160 electrically connected to the drain electrode 135 may be formed on the second insulating interlayer 150. In exemplary embodiments, the second insulating interlayer 150 may be partially removed to form a contact hole (not illustrated) at least partially exposing the drain electrode 135. A third conductive layer (not illustrated) may be formed on the second insulating interlayer 150 and the exposed drain electrode 135, and then the third conductive layer may be patterned to form the first electrode 160. The third conductive layer may be formed using a metal such as chromium, aluminum, tantalum, molybdenum, titanium, tungsten, copper, silver, neodymium, etc., or an alloy of these metals. The third conductive layer may be obtained by a sputtering process, a CVD process, an ALD process, a vacuum evaporation process, a printing process, etc. In one exemplary embodiment, the third conductive layer may be formed using a transparent conductive material, for example, indium tin oxide, zinc tin oxide, indium zinc oxide, zinc oxide, tin oxide, etc. In one exemplary embodiment, the first electrode 160 may have a multi-stacked structure including a first layer and a second layer. The first layer may be formed using, e.g., the above metal or the alloy, and the second layer may be formed using, e.g., the above transparent conductive material.

Figure 7:
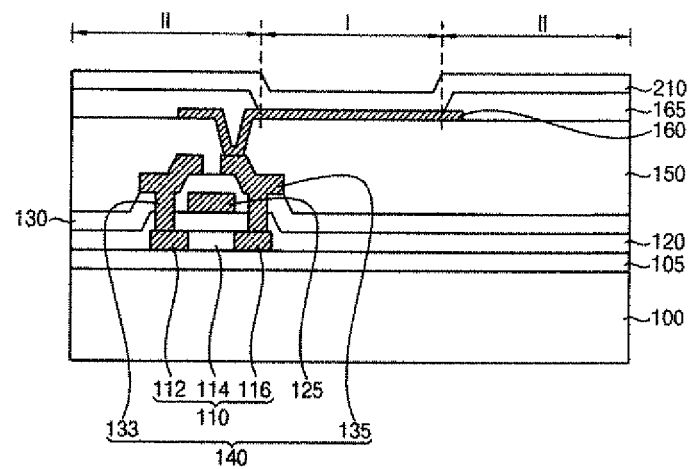

Referring to FIG. 7, a PDL 165 and an HTL 210 may be formed on the second insulating interlayer 150 and the first electrode 160. In exemplary embodiments, a photosensitive material layer (not illustrated) including, e.g., acryl-based resin, polyimide, BCB, etc., may be formed on the second insulating interlayer 150 and the first electrode 160. The photosensitive material layer may be selectively exposed to light using an exposure mask, and then an exposed portion of the photosensitive material layer may be removed by a developing process to form the PDL 165 partially exposing the first electrode 160. In some exemplary embodiments, a non-photosensitive organic material layer or an inorganic material layer may be formed on the second insulating interlayer 150 and the first electrode 160, and then the non-photosensitive organic material layer or the inorganic material layer may be partially etched to form the PDL 165.

By forming the PDL 165, a first region I corresponding to a pixel region of the OLED device and a second region II corresponding to a non-pixel region of the OLED device may be defined. A portion of the first electrode 160 exposed by the PDL 165 may be located in the pixel region. The PDL 165 and a remaining portion of the first electrode 160 may be located in the non-pixel region.

In exemplary embodiments, the PDL 165 may have a thickness of about 1000 Å to about 4000 Å. When the PDL 165 has a thickness less than about 1000 Å, the first region I (pixel region) and the second region II (non-pixel region) may not be distinctly separated from each other, and thus a resolution of the OLED device may be decreased. Meanwhile, in case that the PDL 165 may have a thickness greater than about 4000 Å, an HTL 210 or an HIL may not be deposited continuously on the PDL 165 and the first electrode 160 with a uniform profile.

The HTL 210 may be formed on the PDL 165 and the exposed first electrode 160. The HTL 210 may cover both the pixel region and the non-pixel region. For example, the HTL 210 may be formed by using a hole transport material, e.g., NPB, TPD, α-NPD, N-phenylcarbazole, polyvinylcarbazole. The HTL 210 may be obtained by a vacuum evaporation process, a thermal evaporation process, a slit coating process, a spin coating process, a whole surface printing process, etc.

In one exemplary embodiment, an HIL may be formed on the PDL 165 and the exposed first electrode 160 before forming the HTL 210, and the HTL 210 may be formed on the HIL. The HIL may be formed using, e.g., TCTA, m-MTDATA, m-MTDAPB, 2-TNATA, etc. The HIL may be obtained by a vacuum evaporation process, a thermal evaporation process, a slit coating process, a spin coating process, a whole surface printing process, etc.

Figure 8:
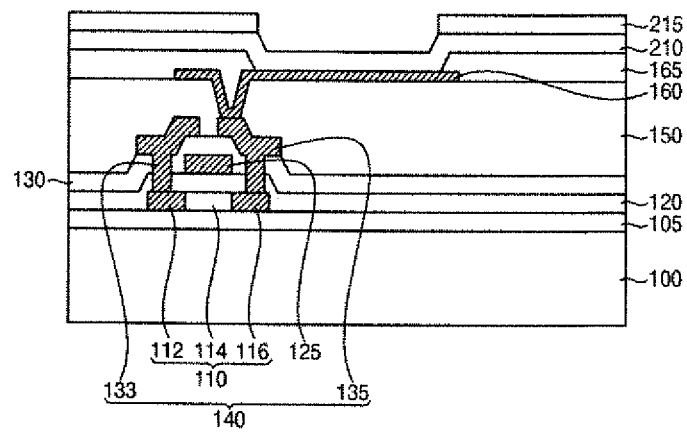

Referring to FIG. 8, a hydrophobic pattern 215 may be formed on a portion of the HTL 210 located in the second region II. In exemplary embodiments, the hydrophobic pattern 215 may be formed using a fluorine-based material. The fluorine-based material may include polymer, oligomer, dendrimer or monomer containing at least one carbon atom combined or hybridized with at least one fluorine atom. These may be used alone or in a mixture thereof.

In exemplary embodiments, the carbon atom may be combined with one fluorine atom ($CF_1$), two fluorine atoms ($CF_2$) or three fluorine atoms ($CF_3$). In one exemplary embodiment, the hydrophobic pattern 215 may be formed using a fluorine-based polymer having a repeating unit represented by —($CF_2$—$CF_2$)n-. Here, n may be an integer in a range of about 2 to 10,000.

In some exemplary embodiments, the hydrophobic pattern 215 may be formed using an organosilane-based material having at least one organic functional group combined with a silicon atom. The organic functional group may include alkyl, alkoxy, halogen, amino, hydroxyl, etc. For example, the organosilane-based material may be represented by a following chemical formula.

Chemical Formula

In the above chemical formula, $R_1$ to $R_4$ may independently represent hydrogen, a $C_1$ to $C_{20}$ alkyl group, a $C_1$ to $C_{20}$ alkoxy group, halogen, an amino group or a hydroxyl group. In exemplary embodiments, at least one of $R_1$ to $R_4$ may be a $C_1$ to $C_{20}$ alkyl group or a $C_1$ to $C_{20}$ alkoxy group. Additionally, the $C_1$ to $C_{20}$ alkyl group or the $C_1$ to $C_{20}$ alkoxy group may have at least one fluorine atom substituent.

As described above, the hydrophobic pattern 215 may include the fluorine-based material or the organosilane-based material so that a difference of surface energy may be generated between the hydrophobic pattern 215 and the HTL 210. Accordingly, an EML 220 may be formed selectively in the first region I substantially corresponding to the pixel region.

In exemplary embodiments, the hydrophobic pattern 215 may be obtained by a laser induced thermal imaging (LITI) process.

Figure 9:
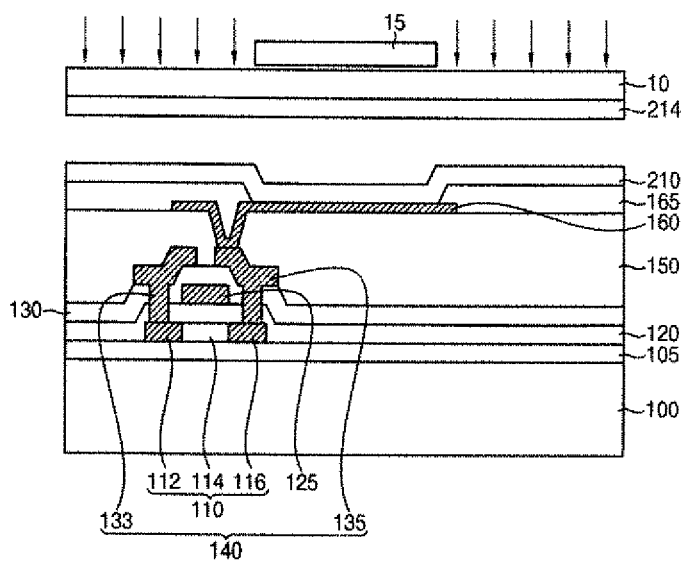

FIG. 9 is a cross-sectional view illustrating a process of forming the hydrophobic pattern 215 on the HTL 210 as an exemplary embodiment according to the principles of the present invention.

Referring to FIG. 9, a hydrophobic layer 214 may be formed on a donor substrate 10 using the above fluorine-based material or the organosilane-based material.

The donor substrate 10 may be arranged or laminated on the first substrate 100 so that the hydrophobic layer 214 may substantially face the HTL 210. A laser beam may be irradiated selectively onto a portion of the hydrophobic layer 214 substantially overlapping the second region II using a mask 15 as indicated by arrows. By such laser irradiation, the hydrophobic layer 214 may be transferred selectively onto the portion of the HTL 210 located in the second region II to form the hydrophobic pattern 215 in the non-pixel region.

In one exemplary embodiment, a light to heat conversion (LTHC) layer (not illustrated) may be formed between the donor substrate 10 and the hydrophobic layer 214. The LTHC layer may absorb a light, e.g., the laser beam to convert the light into a heat. The LTHC layer may be formed using metals such as aluminum or silver, oxides of these metals, sulfides of these metals, etc. Alternatively, the LTHC layer may be formed using carbon black, graphite or polymer containing a light-absorbent material.

In some exemplary embodiments, the hydrophobic pattern 215 may be obtained without the above laser irradiation. For example, the hydrophobic layer 214 on the donor substrate 10 may be laminated on the HTL 210. A heat and a pressure may be applied onto the donor substrate 10 to form the hydrophobic pattern 215 on the HTL 210. The HTL 210 may have a height difference between the first region I and the second region II so that the hydrophobic pattern 215 may be formed selectively on the portion of the HTL 210 located in the second region II.

In some exemplary embodiments, the hydrophobic pattern 215 may be obtained by a printing process, e.g., an inkjet process or a nozzle printing process.

The inkjet or nozzle printing processes may be performed by soluble processes. For example, the fluorine-based material and/or the organosilane material may be mixed in a solvent to prepare a hydrophobic composition. The hydrophobic composition may be printed on the portion of the HTL 210 in the non-pixel region through nozzles of an inkjet printing or a nozzle printing apparatuses. The printed hydrophobic composition may be dried to form the hydrophobic pattern 215.

Alternatively, the inkjet or nozzle printing processes may be performed by insoluble processes. For example, the hydrophobic composition may be introduced into nozzles of the inkjet printing or nozzle printing apparatuses. A temperature of the nozzle may be increased by a first heating so that the solvent of the hydrophobic composition may be evaporated. The solvent-free hydrophobic composition may be vaporized or sublimated by a second heating. The vaporized or sublimated hydrophobic composition may be printed on the portion of the HTL 210 in the non-pixel region through the nozzle to form the hydrophobic pattern 215. The solvent-free hydrophobic composition may be directly printed on the HTL 210, and thus an additional drying process may not be needed. The temperature in the nozzle may be properly adjusted according to boiling points or sublimation points of the fluorine-based material and/or the organosilane material.

In some exemplary embodiments, the hydrophobic pattern 215 may be formed selectively on the portion of the HTL 210 in the non-pixel region by a stamping process, an offset imprinting process or a reverse offset imprinting process.

In exemplary embodiments, the hydrophobic pattern 215 may have a thickness of about 1000 Å to about 3 μm. When the thickness of the hydrophobic pattern 215 is less than about 1000 Å, the EML 220 may not be easily formed only in the first region I. Meanwhile, the thickness of the hydrophobic pattern 215 of grater than about 3 μm may be disadvantageous in an economic aspect and in minimizing a size of the OLED device.

Figure 10:
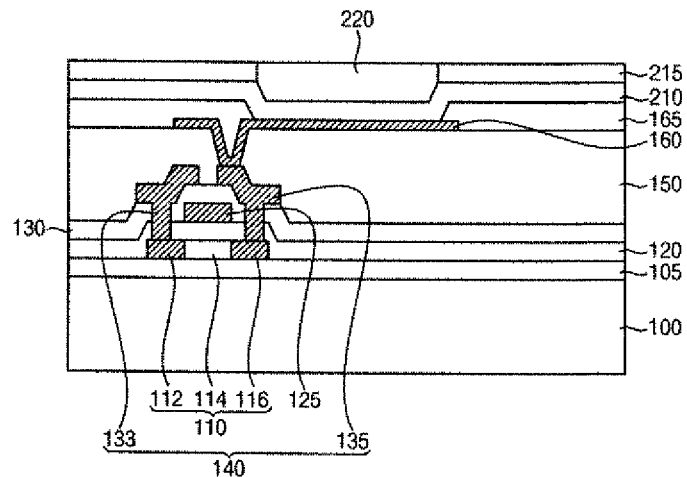

Referring to FIG. 10, the EML 220 may be formed on the portion of the HTL 210 in the first region I. The EML 220 may be formed using at least one of light emitting materials for generating different colors of light, for example, a red color of light, a green color of light or a blue color of light. The EML 220 may be formed using a mixture or a combination of the light emitting materials for generating a white color of light. In one exemplary embodiment, the light emitting materials may serve as dopant materials of the EML 220. In this case, the EML 220 may further include host materials. Suitable dopant and host materials may be selected in accordance with a light-emitting mechanism of the EMI, 220, for example, a fluorescent mechanism or a phosphorescent mechanism.

In exemplary embodiments, the EML 220 may be obtained by a spin coating process, a roll coating process, a nozzle printing process, an inkjet printing process, a transfer process using a donor substrate, etc. In this case, the EML 220 may be confined by the hydrophobic pattern 215 located in the second region II. Thus, the EML 220 may be formed selectively on the portion of the HTL 210 in the first region I, which is relatively hydrophilic. A bottom of the EML 220 may make contact with a top surface of the HTL 210, and a sidewall of the EML 220 may make contact with the HTL 210 and a sidewall of the hydrophobic pattern 215.

Figure 11:
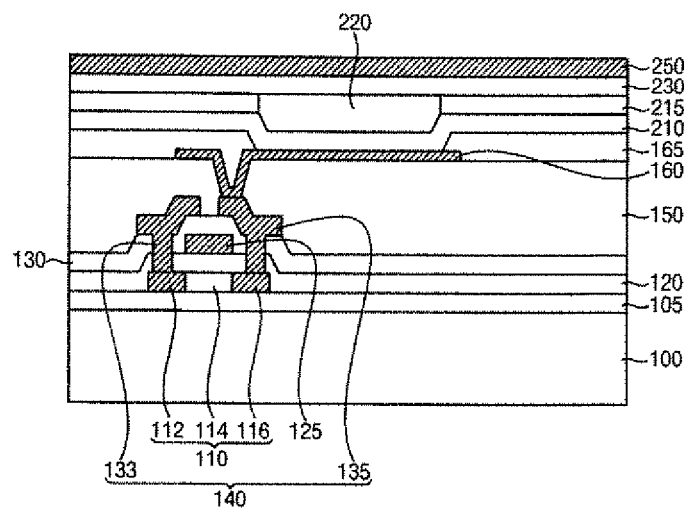

Referring to FIG. 11, an ETL 230 may be formed on the hydrophobic pattern 215 and the EML 220, and a second electrode 250 may be formed on the ETL 230. The ETL 230 and the second electrode 250 may be formed uniformly along a profile of the EML 220 and the hydrophobic pattern 215. For example, the ETL 230 may be formed using Alq, PBD, TAZ, rubrene, etc. The ETL 230 may be obtained by a vacuum evaporation process, a thermal evaporation process, a slit coating process, a spin coating process, etc.

The second electrode 250 may be formed by using a metal or a metal compound such as lithium (Li), calcium (Ca), lithium fluoride/calcium (LiF/Ca), lithium fluoride/aluminum (LiF/Al), aluminum (Al), magnesium (Mg), silver (Ag), chromium (Cr), tungsten (W), molybdenum (Mo), titanium, (Ti), etc., or an alloy of these metals. The second electrode 250 may be obtained by a sputtering process, a CVD process, an ALD process, a vacuum evaporation process, a printing process, etc. The second electrode 250 may have a multi-stacked structure including a first layer and a second layer. The first layer may include, e.g., the above metal or the alloy, and the second layer may include, e.g., the above transparent conductive material.

In one exemplary embodiment, an EIL may be further formed on the ETL 230 before forming the second electrode 250. For example, the EIL may be formed using an alkaline metal, an alkaline earth metal, fluorides of these metals, oxides of these metals, chlorides of these metals, etc. The EIL may be obtained by a vacuum evaporation process, a thermal evaporation process, a slit coating process, a spin coating process, etc.

A protection layer (not illustrated) may be formed on the second electrode 250 and a second substrate (not illustrate) substantially facing the first substrate 100 may be formed on the protection layer. The protection layer may be formed using a transparent insulating material and the second substrate may be substantially the same as or similar to the first substrate 100.

FIGS. 12 to 17 are cross-sectional views illustrating a method of manufacturing an organic light emitting display device including an organic light emitting structure as some exemplary embodiments in accordance with the principles of the present invention.

Figure 12:
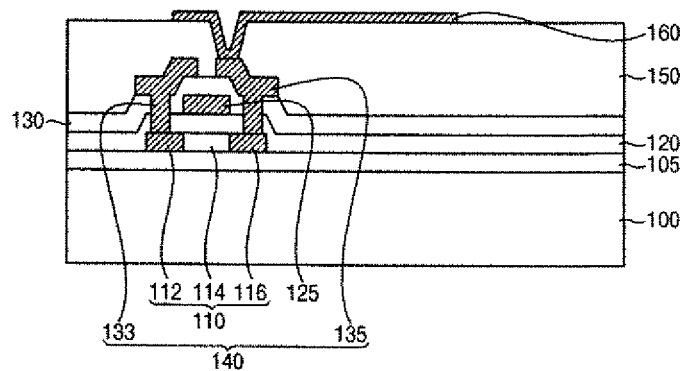
FIGS. 12 to 17 are cross-sectional views illustrating a method of manufacturing an organic light emitting display device including an organic light emitting structure as some exemplary embodiments according to the principles of the present invention.

Referring to FIG. 12, processes substantially the same as or similar to those illustrated with reference to FIGS. 4 to 6 may be performed. Accordingly, a first insulating interlayer 130, a switching device 140 and a second insulating interlayer 150 may be formed on a first substrate 100. A first electrode 160 electrically connected to a drain electrode 135 of the switching device 140 may be formed on the second insulating interlayer 150.

Figure 13:
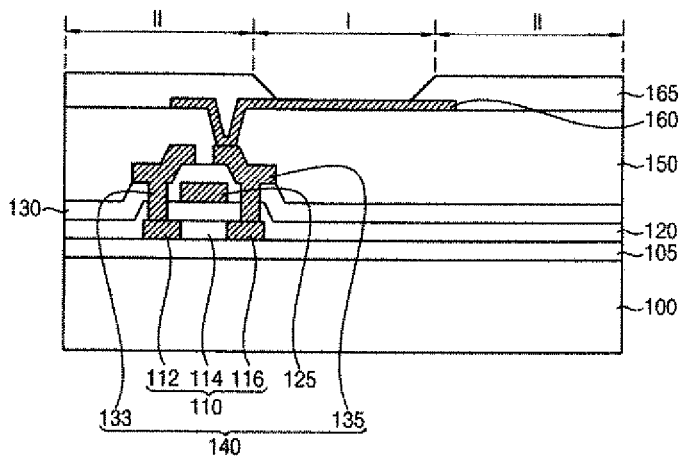

Referring to FIG. 13, a PDL 165 partially exposing the first electrode 160 may be formed on the second insulating interlayer 150 and the first electrode 160. In exemplary embodiments, a photosensitive material layer including, e.g., acryl-based resin, polyimide or BCB may be formed on the second insulating interlayer 150 and the first electrode 160. An exposure process and a developing process may be performed about the photosensitive material layer to form the PDL 165. Alternatively, a non-photosensitive organic material layer or an inorganic material layer may be formed on the second insulating interlayer 150 and the first electrode 160, and then the non-photosensitive organic material layer or the inorganic material layer may be etched to form the PDL 165.

By forming the PDL 165, a first region I substantially corresponding to a pixel region and a second region II substantially corresponding to a non-pixel region may be defined. That is, the second region II may be covered by the PDL 165 and the first electrode 160 may be partially exposed in the first region I.

Figure 14:
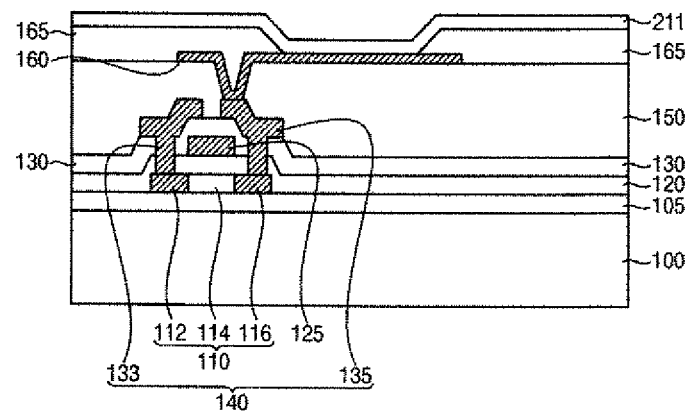

Referring to FIG. 14, a preliminary HTL 211 may be formed on the PDL 165 and the exposed first electrode 160. In exemplary embodiments, the preliminary HTL 211 may be formed by using a photosensitive composition including a hole transport material, a photosensitive monomer, a photopolymerization initiator, an organic solvent, etc. The preliminary HTL 211 may be obtained by a vacuum evaporation process, a thermal evaporation process, a slit coating process, a spin coating process, a printing process, etc. For example, the hole transport material may include TPD, α-NPD, N-phenylcarbazole, polyvinylcarbazole, etc. These may be used alone or in a mixture thereof. The photosensitive monomer may include a material cross-linked or polymerized by an exposure process. The photosensitive monomer may include an acrylate-based monomer or a methacrylate-based monomer. For example, the photosensitive monomer may include 1,4-butanediol acrylate, 1,3-butylene glycol diacrylate, 1,6-hexanediol diacrylate, diethylene glycol diacrylate, ethylene glycol diacrylate, triethylene glycol diacrylate, polyethylene glycol diacrylate, neopentyl glycol diacrylate, propylene glycol diacrylate, dipropylene glycol diacrylate, sorbitol triacrylate, bisphenol A diacrylate derivatives, pentaerythritol triacrylate, pentaerythritol tetraacrylate, pentaerythritol diacrylate, dipentaerythritol pentaacrylate, dipentaerythritol hexaacrylate, trimethyl propane ethoxy triacrylate or methacrylates of these materials. These may be used alone or in a mixture thereof.

The photopolymerization initiator may include an acetophenon-based compound, a benzophenon-based compound, a thioxanthone-based compound, a benzoin-based compound, a triazine-based compound, etc. These may be used alone or in a mixture thereof. Non-limiting examples of the acetophenon-based compound include 2,2'-diethoxy acetophenon, 2,2'-dibutoxy acetophenon, p-t-butyl trichloro acetophenon, 4-chloro acetophenon, etc. Non limiting examples of the benzophenon-based compound may include 4,4'-dimethylamino benzophenon, 4,4'-dichloro benzophenon, 3,3'-dimethyl-2-methoxy benzophenon, hydroxy benzophenon, acrylated benzophenon, 4-phenyl benzophenon, etc. Non limiting examples of the thioxanthone-based compound may include thioxanthone, 2-methyl thioxanthone, isopropyl thioxanthone, 2,4-diethyl thioxanthone, 2,4-diisopropyl thioxanthone, 2-chloro thioxanthone, etc. Non-limiting examples of the benzoin-based compound may include benzoin, benzoin methyl ether, benzoin ethyl ether, benzoin isopropyl ether, benzoin isobutyl ether, etc. Non limiting examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphtyl)-4,6-bis(trichloromethyl)-s-triazine, 2-(p-methoxyphenyl)-4,6-bis(trichloromethyl)-s-triazine, etc. The organic solvent may include a suitable solvent in which the hole transport material, the photosensitive monomer and the photopolymerization initiator may be dissolved. In one exemplary embodiment, the photosensitive composition may further include a surfactant to enhance a coatability thereof.

Figure 15A:
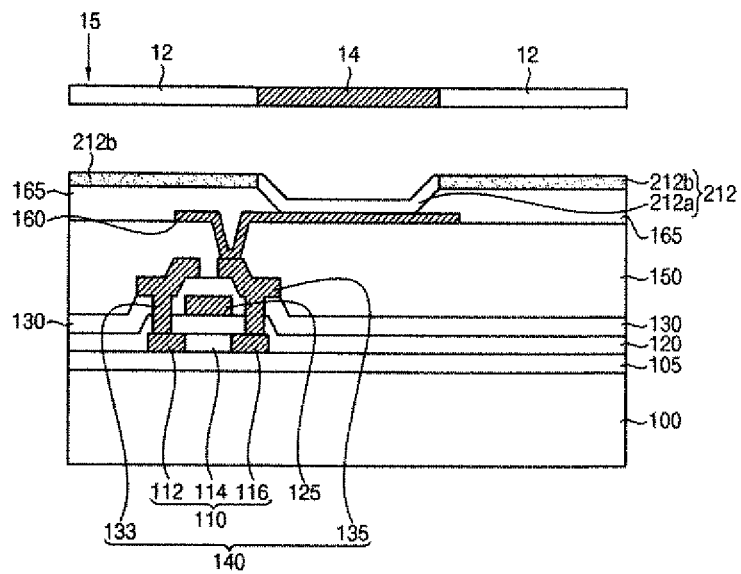

Referring to FIG. 15A, a selective exposure process may be performed about the preliminary HTL 211 so that a portion of the preliminary HTL 211 in the first region I may be transformed into a first pattern 212a and a portion of the preliminary HTL 211 in the second region II may be transformed into a second pattern 212b. Accordingly, an HTL 212 including the first and second patterns 212a and 212b may be obtained.

In exemplary embodiments, a mask 15 including a transparent region 12 and a blocking region 14 may be arranged over the preliminary HTL 211. The transparent region 12 of the mask 15 may substantially overlap the portion of the preliminary HTL 211 in the non-pixel region, and the blocking region 14 of the mask 15 may substantially overlap the portion of the preliminary HTL 211 in the pixel region. A light, e.g., a laser beam or an UV light may be irradiated through the mask 15 so that the portion of the preliminary HTL 211 in the non-pixel region may be selectively exposed to the light. Accordingly, a cross-linking reaction or a polymerization may be induced at the portion of the preliminary HTL 211 in the non-pixel region (the second region II). That is, the photosensitive monomer in the preliminary HTL 211 may be cross-linked or polymerized to form a photosensitive polymer so that the portion of the HTL 212 located in the non-pixel region may be transformed into the second pattern 212b.

The cross-linking reaction or the polymerization may not occur at the portion of the HTL 212 in the pixel region (the first region I), and thus the photosensitive polymer may not be produced in the first region I. The photosensitive monomer, the photopolymerization initiator and the organic solvent remaining in the portion of the preliminary HTL 211 in the first region I may be vaporized to form the first pattern 212a in the first region I. In some exemplary embodiments, a baking process may be additionally performed to cure the photosensitive polymer in the second pattern 212b and to remove the photosensitive monomer, the photopolymerization initiator and the organic solvent remaining in the first pattern 212a. In some exemplary embodiments, the photosensitive monomer, the photopolymerization initiator and the organic solvent remaining in the first pattern 212a may be removed using an additional developing solution.

Meanwhile, a width of the blocking region 14 of the mask 15 may be adjusted to vary a region in which the second pattern 212b is formed.

Figure 15B:
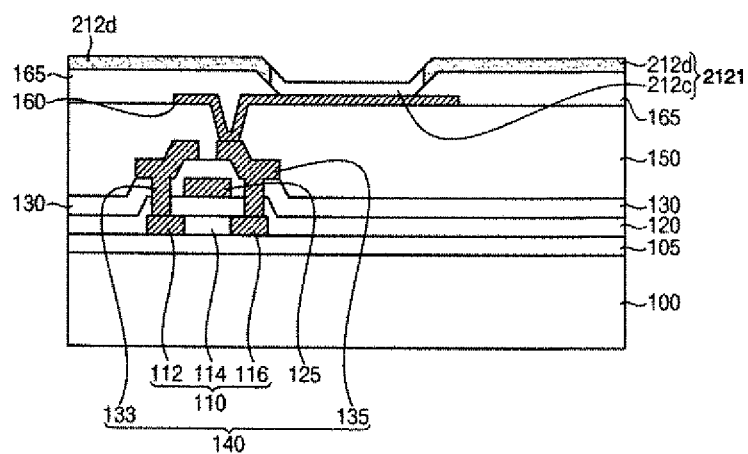

Referring to FIG. 15B, in another embodiment according to the principles of the present invention, the second pattern 212d may be formed on a top surface of the PDL 165 and on a portion of a sidewall of the PDL 165. In this case, the first pattern 212c may be formed on the exposed electrode 160 and on a portion of the sidewall of the PDL 165 not covered by the second pattern 212d.

Figure 15C:
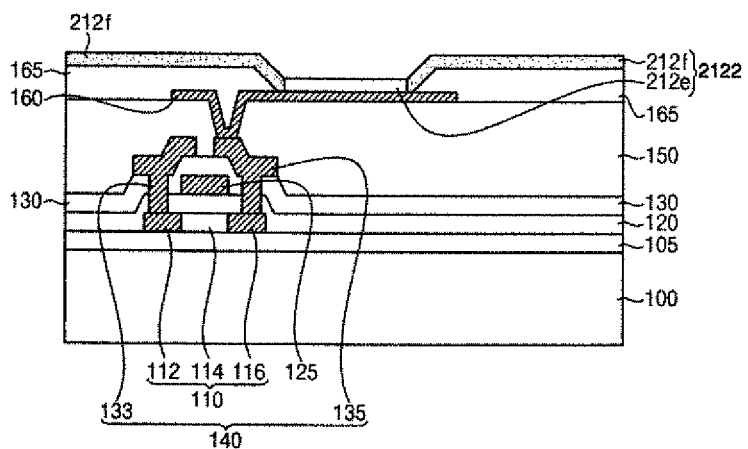

Referring to FIG. 15C, in still another embodiment according to the principles of the present invention, the second pattern 212f may be formed on the top surface and the sidewall of the PDL 165. In this case, the first pattern 212e may be formed on the exposed first electrode 160.

Figure 15D:
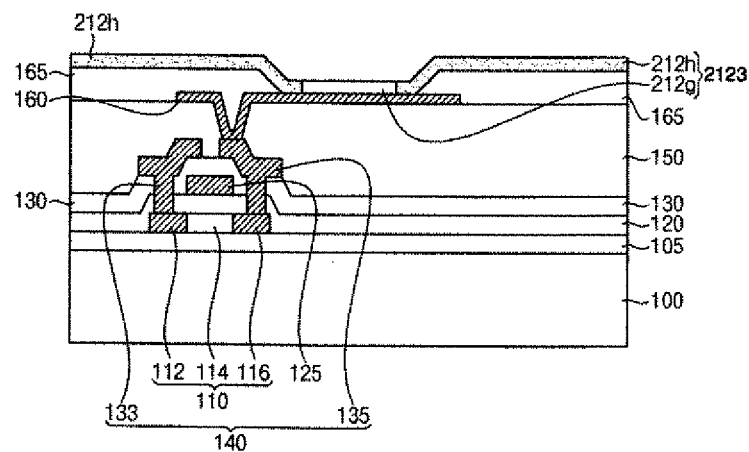

Referring to FIG. 15D, in a further embodiment according to the principles of the present invention, the second pattern 212h may be formed on the top surface and the sidewall of the PDL 165 and on a portion of the exposed first electrode 160. In this case, the first pattern 212g may be formed on a portion of the first electrode 160 not covered by the second pattern 212h.

According to exemplary embodiments, the HTL 212 may include the first pattern 212a located in the pixel region I and the second pattern 212b located in the non-pixel region. The first pattern 212a may include the hole transport material, while the photosensitive monomer, the photopolymerization initiator and the organic solvent may be removed therefrom. Thus, the first pattern 212a may have a relatively high electrical conductivity. The second pattern 212b may further include the photosensitive polymer produced by cross-linking or polymerizing the photosensitive monomer. Thus, the second pattern 212b may have a relatively low electrical conductivity. That is, the electrical conductivity may be selectively allowed in the pixel region so that charges generated from the pixel region may be prevented from being diffused into the non-pixel region. Further, as illustrated in FIGS. 15B to 15D, the regions in which the second patterns 212d, 212f and 212h are formed may be adjusted to properly confine a region to which holes may be moved or transferred. Therefore, various characteristics of the OLED device, for example, luminescence property, color purity, distribution of brightness, etc., may be improved.

In one exemplary embodiment, an HIL may be formed on the PDL 165 and the exposed first electrode 160 before forming the HTL 212, and then the HTL 212 may be formed on the HIL. The HIL may be formed using a hole injection material, e.g., TCTA, m-MTDATA, m-MTDAPB, 2-TNATA, etc. The HIL may be obtained by a vacuum evaporation process, a thermal evaporation process, a spin coating process, a slit coating process, a printing process, etc.

Hereinafter, subsequent processes in the case that the second pattern 212b is limited on the top surface of the PDL 165 as illustrated in FIG. 15A are described.

Figure 16:
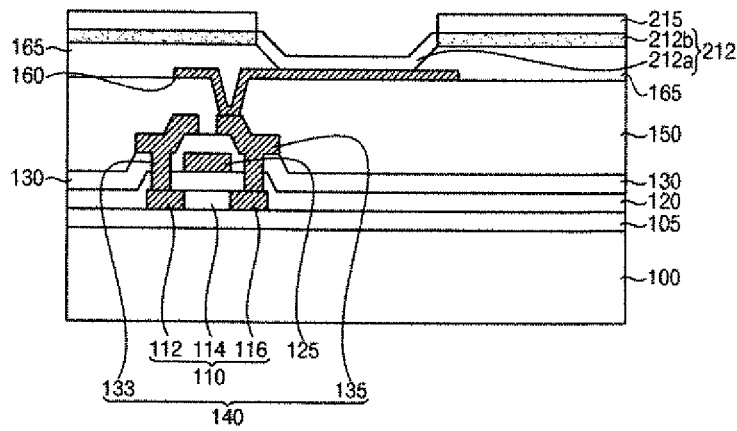

Referring to FIG. 16, a hydrophobic pattern 215 may be formed on the second pattern 212b of the HTL 212 located in the non-pixel region. The hydrophobic pattern 215 may be obtained by processes substantially the same as or similar to those illustrated with reference to FIGS. 8 and 9. The second pattern 212b may include the polymer having a relatively low electrical conductivity so that the hydrophobic pattern 212 may be easily formed selectively in the non-pixel region.

Figure 17:
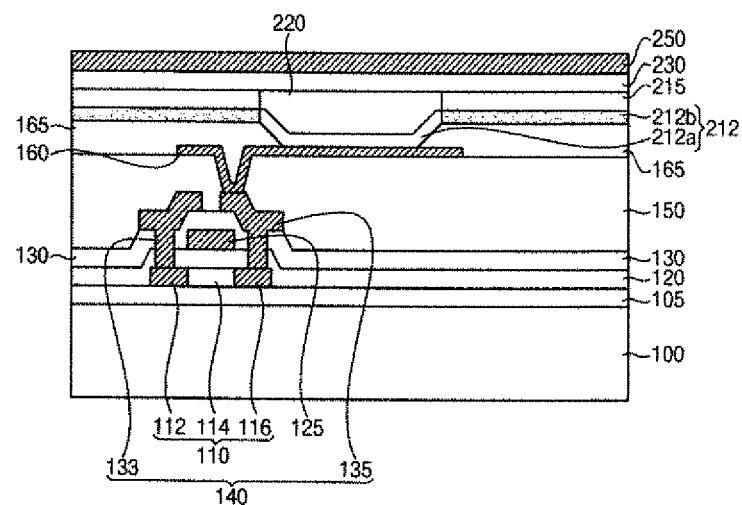

Referring to FIG. 17, processes substantially the same as or similar to those illustrated with reference to FIGS. 10 and 11 may be performed. Accordingly, an EML 220 may be formed on the HTL 212 in the pixel region. i.e., on the first pattern 212a, and then an ETL 230 and a second electrode 250 may be sequentially formed on the hydrophobic pattern 215 and the EML 220. The EML 220 may be formed selectively in the pixel region that may be relatively hydrophilic, because the hydrophobic pattern 215 may be formed in the non-pixel region.

In one exemplary embodiment, an EIL may be further formed between the ETL 230 and the second electrode 250. The EIL may be formed using an alkaline metal, an alkaline earth metal, fluorides of these metals, chlorides of these metals, oxides of these metals, etc. The EIL may be obtained by a vacuum evaporation process, a thermal evaporation process, a slit coating process, a spin coating process.

Figure 18:
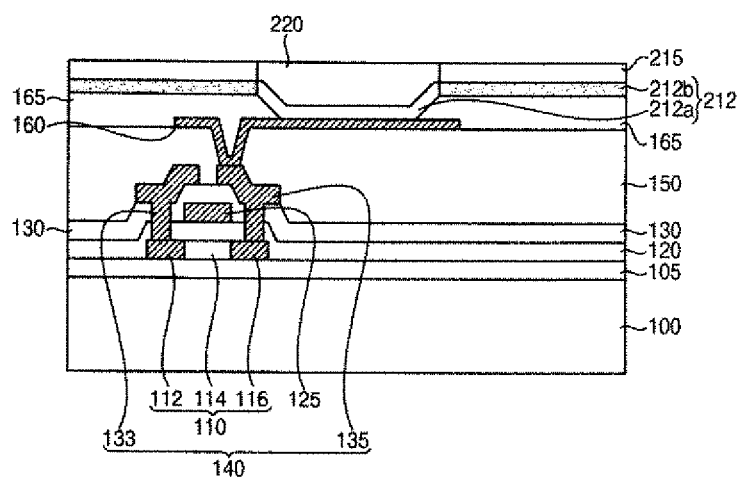
FIGS. 18 to 20 are cross-sectional views illustrating a method of manufacturing an organic light emitting display device including an organic light emitting structure as an exemplary embodiment according to the principles of the present invention.
Figure 19:
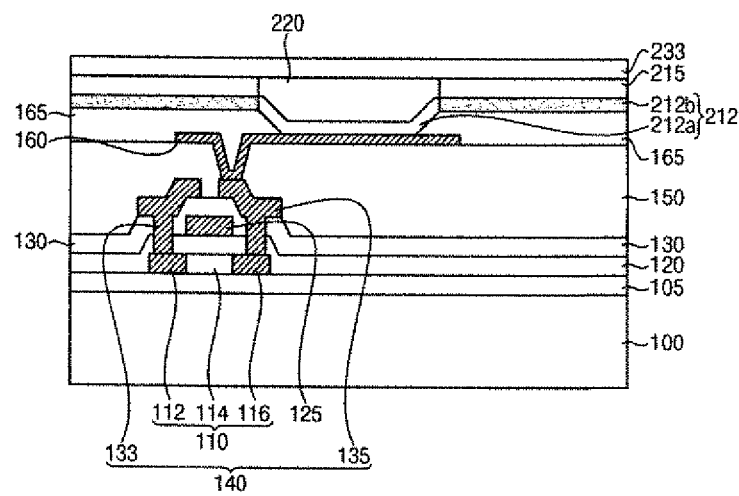
Figure 20:
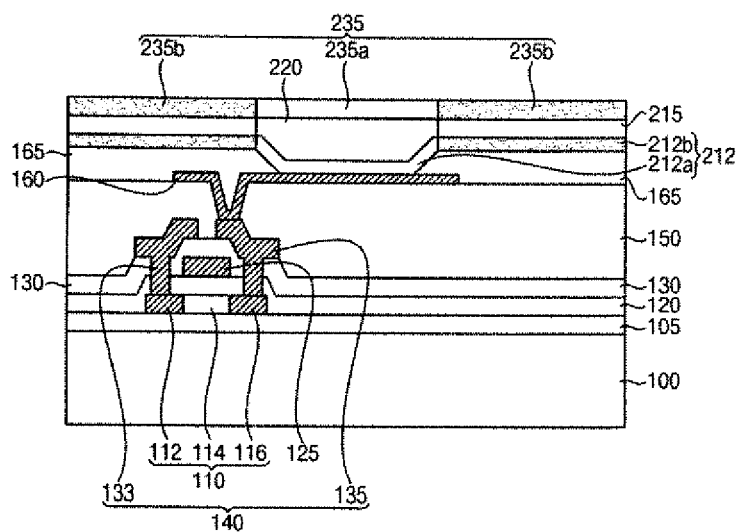

FIGS. 18 to 20 are cross-sectional views illustrating a method of manufacturing an organic light emitting display device including an organic light emitting structure as some exemplary embodiments according to the principles of the present invention.

Referring to FIG. 18, processes are substantially the same as or similar to those illustrated with reference to FIGS. 12 to 16. Accordingly, a switching device 140 may be formed on a first substrate 100, and then a second insulating interlayer 150, a first electrode 160, a PDL 165, an HTL 212 including a first pattern 212a and a second pattern 212b and a hydrophobic pattern 215 may be formed on the first substrate 100. The hydrophobic pattern 215 may be formed in a non-pixel region of the OLED device. An EML 220 may be formed on a portion of the HTL 212 located in a pixel region of the OLED device. In exemplary embodiments, the EML 220 may be confined by the hydrophobic pattern 215.

Regions in which the first and second patterns of the HTL 212 are formed may be adjusted as illustrated in FIGS. 15B to 15D. Hereinafter, subsequent processes in the case that the second pattern 212b is limited on the top surface of the PDL 165 as illustrated in FIG. 15A are described.

Referring to FIG. 19, a preliminary ETL 233 may be formed on the hydrophobic pattern 215 and the EML 220. The preliminary ETL 233 may be formed using a photosensitive composition that may include an electron transport material, a photosensitive monomer, a photopolymerization initiator, an organic solvent, etc. The preliminary ETL 233 may be obtained by a vacuum evaporation process, a thermal evaporation process, a slit coating process, a spin coating process, a printing process, etc.

In exemplary embodiments, the electron transport material may include, e.g., Alq, PBD, TAZ, rubrene, etc. The photosensitive monomer and the photopolymerization initiator may be substantially the same as those for the preliminary HTL 211 described with reference to FIG. 14.

Referring to FIG. 20, processes are substantially the same as or similar to those illustrated with reference to FIG. 15 may be performed about the preliminary ETL 233. Accordingly, a portion of the preliminary ETL 233 located in the pixel region may be transformed into a third pattern 235a and a portion of the preliminary ETL 233 located in the non-pixel region may be transformed into a fourth pattern 235a. That is, an ETL 235 including the third and fourth patterns 235a and 235b may be formed on the EML 220 and the hydrophobic pattern 215.

In some exemplary embodiments, the fourth pattern 235b may be formed on the hydrophobic pattern 215 and on a portion of the EML 220. In this case, the third pattern 235a may be formed on a portion of the EML 220 not covered by the fourth pattern 235b.

In exemplary embodiments, the photosensitive monomer, the photopolymerization initiator and the organic solvent may be removed from the third pattern 235a so that the third pattern 235a may only include the electron transport material. Thus, the third pattern 235a of the ETL 235 may have a predetermined electrical conductivity. In contrast, the fourth pattern 235b of the ETL 235 may include polymer produced by a cross-linking reaction or a polymerization of the photosensitive monomer, thereby to have a relatively low electrical conductivity.

According to exemplary embodiments, both the HTL 212 and the ETL 235 may have relatively low electrical conductivity in the non-pixel region so that charges may be prevented from being diffused in a lateral direction. Additionally, a region in which the fourth pattern 235b is formed may be properly adjusted so that a region to which electrons may be moved or transported may be properly confined. Therefore, the OLED device may have more enhanced luminescence characteristics.

Processes substantially the same as or similar to those illustrated with reference to FIG. 17 may be performed to form a second electrode (not illustrated) on the ETL 235. In one exemplary embodiment, an EIL may be formed on the ETL 235 before forming the second electrode. A protection layer (not illustrated) and a second substrate (not illustrated) may be further formed on the second electrode.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting structure comprising:
   a substrate having a first region and a second region;
   a pixel defining layer selectively on the second region of the substrate;
   a hole transport layer (HTL) continuously on the first region and the second region of the substrate;
   an emitting layer (EML) disposed on and contacting the hole transport layer in the first region;
   a hydrophobic pattern disposed on and contacting the hole transport layer in the second region; and
   an electron transport layer (ETL) disposed on the hydrophobic pattern and the emitting layer,
   wherein the first region contacts and does not overlap the second region,
   a surface of the hole transport layer in the first region is relatively hydrophilic with respect to a surface of the hole transport layer in the second region, and
   the hole transport layer contacts a bottom surface of the hydrophobic pattern and a top surface of the pixel defining layer.

2. The organic light emitting structure of claim 1, wherein the first region corresponds to a pixel region and the second region corresponds to a non-pixel region.

3. The organic light emitting structure of claim 1, wherein the emitting layer is confined by the hydrophobic pattern.

4. The organic light emitting structure of claim 1, further comprising a hole injection layer (HIL) disposed beneath the hole transport layer.

5. The organic light emitting structure of claim 1, further comprising an electron injection layer (EIL) disposed on the electron transport layer.

6. The organic light emitting structure of claim 1, wherein the hydrophobic pattern includes at least one fluorine-based material selected from the group consisting of polymer, oligomer, dendrimer and monomer containing at least one carbon atom combined or hybridized with at least one fluorine atom, or includes at least one organosilane-based material containing at least one organic functional group combined with a silicon atom.

7. The organic light emitting structure of claim 6, wherein the fluorine-based material has a repeating unit represented by a formula of —$(CF_2$—$CF_2)n$-.

8. The organic light emitting structure of claim 6, wherein the organosilane-based material is represented by a following chemical formula;

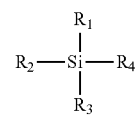

Chemical Formula wherein each of $R_1$ to $R_4$ independently represents hydrogen, a $C_1$ to $C_{20}$ alkyl group, a $C_1$ to $C_{20}$ alkoxy group, halogen, an amino group or a hydroxyl group, and at least one of $R_1$ to $R_4$ represents a $C_1$ to $C_{20}$ alkyl group or a $C_1$ to $C_{20}$ alkoxy group.

9. The organic light emitting structure of claim 8, wherein the $C_1$ to $C_{20}$ alkyl group or the $C_1$ to $C_{20}$ alkoxy group has at least one fluorine atom substituent.

10. The organic light emitting structure of claim 1, wherein the hydrophobic pattern has a thickness of about 1,000 Å to about 3 μm.

11. The organic light emitting structure of claim 1, wherein the hole transport layer includes:
    a first pattern located in the first region; and
    a second pattern located in the second region.

12. The organic light emitting structure of claim 11, wherein the first pattern includes a hole transport material, and the second pattern includes a hole transport material and a cross-linked or polymerized photosensitive material.

13. The organic light emitting structure of claim 12, wherein the second pattern has an electrical conductivity lower than that of the first pattern.

14. The organic light emitting structure of claim 12, wherein the photosensitive material includes an acrylate-based material or a methacrylate-based material.

15. The organic light emitting structure of claim 1, wherein the electron transport layer includes a third pattern and a fourth pattern, the third pattern and the fourth pattern overlapping the first region and the second region, respectively.

16. The organic light emitting structure of claim 15, wherein the third pattern includes an electron transport material, and the fourth pattern includes an electron transport material and a cross-linked or polymerized photosensitive material.

17. The organic light emitting structure of claim 16, wherein the fourth pattern has an electrical conductivity lower than that of the third pattern.

18. An organic light emitting display device comprising:
a first substrate having a pixel region and a non-pixel region;
a first electrode disposed on the first substrate;
a pixel defining layer (PDL) disposed on the first substrate, the pixel defining layer partially exposing the first electrode in the pixel region;
a hole transport layer disposed continuously on the pixel defining layer and the exposed first electrode;
a hydrophobic pattern disposed on and contacting the hole transport layer in the non-pixel region;
an emitting layer disposed on and contacting the hole transport layer in the pixel region;
an electron transport layer disposed on the hydrophobic pattern and the emitting layer; and
a second electrode disposed on the electron transport layer,
wherein the pixel region contacts and does not overlap the non-pixel region, a surface of the hole transport layer in the pixel region is relatively hydrophilic with respect to a surface of the hole transport layer in the non-pixel region, and
the hole transport layer contacts a bottom surface of the hydrophobic pattern and a top surface of the pixel defining layer.

19. The device of claim 18, further comprising a switching device disposed on the first substrate, the switching device being electrically connected to the first electrode.

20. The device of claim 18, further comprising a hole injection layer disposed on the pixel defining layer and the exposed first electrode, and beneath the hole transport layer.

21. The device of claim 18, further comprising an electron injection layer disposed between the electron transport layer and the second electrode.

22. The device of claim 18, wherein the pixel defining layer has a thickness of about 1,000 Å to about 4,000 Å.

23. The device of claim 18, wherein the hole transport layer includes a first pattern and a second pattern, the second pattern having an electrical conductivity lower than that of the first pattern.

24. The device of claim 23, wherein the first pattern is disposed on the exposed first electrode and a sidewall of the pixel defining layer, and the second pattern is disposed on a surface of the pixel defining layer.

25. The device of claim 23, wherein the first pattern is disposed on the exposed first electrode and a portion of a sidewall of the pixel defining layer, and the second pattern is disposed on a surface of the pixel defining layer and on a portion of the sidewall of the pixel defining layer not covered by the first pattern.

26. The device of claim 23, wherein the first pattern is disposed on the exposed first electrode, and the second pattern is disposed on a surface and a sidewall of the pixel defining layer.

27. The device of claim 23, wherein the first pattern is disposed on a portion of the exposed first electrode, and the second pattern is disposed on the pixel defining layer and on a portion of the exposed first electrode not covered by the first pattern.

28. The device of claim 18, wherein the electron transport layer includes a third pattern and a fourth pattern, the fourth pattern having an electrical conductivity lower than that of the third pattern.

29. The device of claim 28, wherein the third pattern is disposed on the emitting layer and the fourth pattern is disposed on the hydrophobic pattern.

30. The device of claim 28, wherein the third pattern is disposed on a portion of the emitting layer, and the fourth pattern is disposed on the hydrophobic pattern and on a portion of the emitting layer not covered by the third pattern.

31. A method of forming an organic light emitting structure, comprising:
providing a substrate having a first region and a second region;
forming a pixel defining layer selectively on the second region of the substrate;
forming a hole transport layer continuously on the first region and the second region of the substrate;
forming a hydrophobic pattern on and contacting the hole transport layer in the second region;
forming an emitting layer on and contacting the hole transport layer in the first region; and
forming an electron transport layer on the hydrophobic pattern and the emitting layer,
wherein the first region contacts and does not overlap the second region,
a surface of the hole transport layer in the first region is relatively hydrophilic with respect to a surface of the hole transport layer in the second region, and
the hole transport layer contacts a bottom surface of the hydrophobic pattern and a top surface of the pixel defining layer.

32. The method of claim 31, wherein the step of forming the hydrophobic pattern includes:
forming a hydrophobic layer on a donor substrate;
arranging the donor substrate over the hole transport layer so that the hydrophobic layer faces the hole transport layer; and
irradiating a laser beam selectively in the second region to transfer a portion of the hydrophobic layer onto the hole transport layer.

33. The method of claim 31, wherein the step of forming the hydrophobic pattern includes:
forming a hydrophobic layer on a donor substrate;
arranging the donor substrate on the hole transport layer so that the hydrophobic layer faces the hole transport layer; and
applying a pressure and a heat to the donor substrate to form the hydrophobic pattern on the hole transport layer in the second region.

34. The method of claim 31, wherein the step of forming the hydrophobic pattern includes an inkjet printing process, a nozzle printing process, a stamping process, an offset imprinting process or a reverse offset imprinting process.

35. The method of claim 34, wherein the step of forming the hydrophobic pattern includes a soluble process that includes providing a hydrophobic composition on the hole transport layer in the second region, the hydrophobic composition including a fluorine-based material or an organosilane-based material and a solvent.

36. The method of claim 34, wherein the step of forming the hydrophobic pattern include an insoluble process that includes:
vaporizing or sublimating a fluorine-based material or an organosilane-based material; and providing the fluorine-based material or the organosilane-based material on the hole transport layer in the second region.

37. The method of claim 31, wherein the step of providing the hole transport layer includes:
   providing a preliminary hole transport layer including a photosensitive composition; and
   selectively exposing a portion of the preliminary hole transport layer in thesecond region to light.

38. The method of claim 37, wherein the photosensitive composition includes a hole transport material, a photosensitive monomer, a photopolymerization initiator and an organic solvent.

39. The method of claim 38, wherein the portion of the preliminary hole transport layer in the second region is transformed into a second pattern by a cross-linking reaction or a polymerization, and
   wherein a portion of the preliminary hole transport layer in the first region is transformed into a first pattern.

40. The method of claim 39, wherein the first pattern includes the hole transport material, and the second pattern includes the hole transport material and a polymer produced by cross-linking or polymerizing the photosensitive monomer.

41. The method of claim 37, further comprising performing a baking process after selectively exposing the portion of the preliminary hole transport layer in the second region to a light.

42. The method of claim 39, further comprising removing the photosensitive monomer, the photopolymerization initiator and the organic solvent remaining in the first pattern by providing a developing solution after selectively exposing the portion of the preliminary hole transport layer in the second region to light.

43. The method of claim 31, wherein the step of forming the electron transport layer includes:
   forming a preliminary electron transport layer on the emitting layer and the hydrophobic pattern, the preliminary electron transport layer including a photosensitive composition; and
   selectively exposing a portion of the preliminary electron transport layer on the hydrophobic pattern to light.

44. The method of claim 43, wherein the photosensitive composition includes an electron transport material, a photosensitive monomer, a photopolymerization initiator and an organic solvent.

45. The method of claim 44, wherein the portion of the preliminary electron transport layer on the hydrophobic pattern is transformed into a fourth pattern by a cross-linking reaction or a polymerization, and
   wherein a portion of the preliminary electron transport layer on the emitting layer is transformed into a third pattern.

46. The method of claim 45, wherein the third pattern includes the electron transport material, and the fourth pattern includes the electron transport material and a polymer produced by cross-linking or polymerizing the photosensitive monomer.

47. The method of claim 43, further comprising performing a baking process after selectively exposing the portion of the preliminary electron transport layer on the hydrophobic pattern to the light.

48. The method of claim 45, further comprising removing the photosensitive monomer, the photopolymerization initiator and the organic solvent remaining in the third pattern by providing a developing solution after selectively exposing the portion of the preliminary electron transport layer on the hydrophobic pattern to the light.

49. The method of claim 31, further comprising providing a hole injection layer before providing the hole transport layer.

50. The method of claim 31, further comprising forming an electron injection layer on the electron transport layer.

51. The method of claim 31, wherein the hydrophobic pattern has a thickness of about 1,000 Å to about 3 μm.

52. A method of manufacturing an organic light emitting display device, comprising:
   forming a first electrode on a first substrate having a pixel region and a non-pixel region;
   forming a pixel defining layer on the first substrate, the pixel defining layer partially exposing the first electrode;
   forming a hole transport layer continuosly on the pixel defining layer and the exposed first electrode;
   forming a hydrophobic pattern on the hole transport layer in the non-pixel region;
   forming an emitting layer on the hole transport layer in the pixel region;
   forming an electron transport layer on the hydrophobic pattern and the emitting layer; and
   forming a second electrode on the electron transport layer,
   wherein the pixel region contacts and does not overlap the non-pixel region, a surface of the hole transport layer in the pixel region is relatively hydrophilic with respect to a surface of the hole transport layer in the non-pixel region, and
   the hole transport layer contacts a bottom surface of the hydrophobic pattern and a top surface of the pixel defining layer.

53. The method of claim 52, wherein the hydrophobic pattern is formed by using at least one fluorine-based material selected from the group of polymer, oligomer, dendrimer and monomer containing at least one carbon atom combined or hybridized with at least one fluorine atom, or by using at least one organosilane-based material containing at least one organic functional group combined with a silicon atom.

54. The method of claim 52, wherein the step of forming the hydrophobic pattern includes:
   forming a hydrophobic layer on a donor substrate;
   arranging the donor substrate over the hole transport layer so that the hydrophobic layer faces the hole transport layer; and
   irradiating a laser beam selectively in the non-pixel region to transfer a portion of the hydrophobic layer onto the hole transport layer.

55. The method of claim 52, wherein the step of forming the hydrophobic pattern includes:
   forming a hydrophobic layer on a donor substrate;
   arranging the donor substrate on the hole transport layer so that the hydrophobic layer faces the hole transport layer; and
   applying a pressure and a heat to the donor substrate to form the hydrophobic pattern on the hole transport layer in the non-pixel region.

56. The method of claim 52, wherein the step of forming the hydrophobic pattern includes an inkjet printing process, a nozzle printing process, a stamping process, an offset imprinting process or a reverse offset imprinting process.

57. The method of claim 56, wherein the step of forming the hydrophobic pattern includes a soluble process that includes providing a hydrophobic composition on the hole transport layer in the non-pixel region, the hydrophobic composition including a fluorine-based material or an organosilane-based material and a solvent.

58. The method of claim 56, wherein the step of forming the hydrophobic pattern includes an insoluble process that includes:

vaporizing or sublimating a fluorine-based material or an organosilane-based material; and providing the fluorine-based material or the organosilane-based material on the hole transport layer in the non-pixel region.

59. The method of claim 52, wherein the step of forming the hole transport layer includes:

forming a preliminary hole transport layer including a photosensitive composition on the pixel defining layer and the exposed first electrode; and selectively exposing a portion of the preliminary hole transport layer on the pixel defining layer to a light.

60. The method of claim 59, wherein:

a portion of the preliminary hole transport layer on a surface of the pixel defining layer is transformed into a second pattern by a cross-linking reaction or a polymerization, and a portion of the preliminary hole transport layer on a sidewall of the pixel defining layer and the exposed first electrode is transformed into a first pattern.

61. The method of claim 59, wherein:

a portion of the preliminary hole transport layer on a surface and a portion of a sidewall of the pixel defining layer is transformed into a second pattern by a cross-linking reaction or a polymerization, and a portion of the preliminary hole transport layer on the sidewall of the pixel defining layer not covered by the second pattern and on the exposed first electrode is transformed into a first pattern.

62. The method of claim 59, wherein:

a portion of the preliminary hole transport layer on a surface and a sidewall of the pixel defining layer is transformed into a second pattern by a cross-linking reaction or a polymerization, and a portion of the preliminary hole transport layer on the exposed first electrode is transformed into a first pattern.

63. The method of claim 59, wherein:

a portion of the preliminary hole transport layer on the pixel defining layer and a portion of the exposed first electrode is transformed into a second pattern by a cross-linking reaction or a polymerization, and a portion of the preliminary hole transport layer on the exposed first electrode not covered by the second pattern is transformed into a first pattern.

64. The method of claim 52, wherein the step of forming the electron transport layer includes:

forming a preliminary electron transport layer on the emitting layer and the hydrophobic pattern, the preliminary electron transport layer including a photosensitive composition; and selectively exposing a portion of the preliminary electron transport layer in the non-pixel region to a light.

65. The method of claim 64, wherein:

a portion of the preliminary electron transport layer on the hydrophobic pattern is transformed into a fourth pattern by a cross-linking reaction or a polymerization, and a portion of the preliminary electron transport layer on the emitting layer is transformed into a third pattern.

66. The method of claim 64, wherein:

a portion of the preliminary electron transport layer on the hydrophobic pattern and a portion of the emitting layer is transformed into a fourth pattern by a cross-linking reaction or a polymerization, and a portion of the preliminary electron transport layer on the emitting layer not covered by the fourth pattern is transformed into a third pattern.

67. The method of claim 52, further comprising forming a hole injection layer on the pixel defining layer and the exposed first electrode before forming the hole transport layer.

68. The method of claim 52, further comprising forming an electron injection layer on the electron transport layer after forming the electron transport layer.

69. The method of claim 31, further comprising forming a pixel defining layer in the second region before providing the hole transport layer, wherein the hole transport layer is disposed between the pixel defining layer and the hydrophobic pattern, and the hole transport layer directly contacts a bottom surface of the hydrophobic pattern.

70. The method of claim 52, wherein the hole transport layer is disposed between the pixel defining layer and the hydrophobic pattern, and the hole transport layer directly contacts a bottom surface of the hydrophobic pattern.

* * * * *